(12) United States Patent
Qin et al.

(10) Patent No.: US 11,380,644 B2
(45) Date of Patent: Jul. 5, 2022

(54) SEMICONDUCTOR PACKAGE INCLUDING WORKPIECE AND METHOD FOR FABRICATING THE SEMICONDUCTOR PACKAGE

(71) Applicants: Shanghai Tianma Micro-Electronics Co., Ltd., Shanghai (CN); Shanghai AVIC OPTO Electronics Co., Ltd., Shanghai (CN)

(72) Inventors: Feng Qin, Shanghai (CN); Kerui Xi, Shanghai (CN); Tingting Cui, Shanghai (CN); Jie Zhang, Shanghai (CN); Xuhui Peng, Shanghai (CN)

(73) Assignees: Shanghai Tianma Micro-Electronics Co., Ltd., Shanghai (CN); Shanghai AVIC OPTO Electronics Co., Ltd., Shanghai (CN)

( * ) Notice: Subject to any disclaimer, the term of this patent is extended or adjusted under 35 U.S.C. 154(b) by 0 days.

(21) Appl. No.: 16/917,155

(22) Filed: Jun. 30, 2020

(65) Prior Publication Data

US 2021/0351150 A1 Nov. 11, 2021

(30) Foreign Application Priority Data

May 11, 2020 (CN) .......................... 202010393127.X

(51) Int. Cl.
*H01L 21/56* (2006.01)
*H01L 23/00* (2006.01)
*H01L 23/31* (2006.01)

(52) U.S. Cl.
CPC ............ *H01L 24/19* (2013.01); *H01L 21/561* (2013.01); *H01L 23/3121* (2013.01);
(Continued)

(58) Field of Classification Search
CPC ....... H01L 23/31; H01L 23/528; H01L 21/56; H01L 23/498; H01L 21/561;
(Continued)

(56) References Cited

U.S. PATENT DOCUMENTS

2015/0014855 A1* 1/2015 Yap .................... H01L 24/82
257/773
2015/0371932 A1* 12/2015 Hu ..................... H01L 21/4825
257/666

FOREIGN PATENT DOCUMENTS

| CN | 106169452 A | 11/2016 |
| CN | 108231716 A | 6/2018 |
| CN | 108400119 A | 8/2018 |

OTHER PUBLICATIONS

Chinese Office Action for related Application No. 202010393127.X reported on May 25, 2021.

* cited by examiner

*Primary Examiner* — Didarul A Mazumder
(74) *Attorney, Agent, or Firm* — von Briesen & Rope, s.c.

(57) ABSTRACT

Provided are a semiconductor package and a method for fabricating the semiconductor package. The method includes followings steps: a first workpiece is provided, where the first workpiece includes a first substrate and multiple first rewiring structures arranged on the first substrate at intervals, and each first rewiring structure includes at least two first rewiring layers; an encapsulation layer is formed on the first rewiring structures, where the encapsulation layer is provided with multiple first through holes, and the first through holes exposes one first rewiring layer; at least two second rewiring layers are disposed on a side of the encapsulation layer facing away from the first rewiring layer; multiple semiconductor elements are provided, where the semiconductor elements are arranged on a side of the (Continued)

first rewiring structures facing away from the encapsulation layer, where the first rewiring layers are electrically connected to pins of the semiconductor elements.

12 Claims, 23 Drawing Sheets

(52) U.S. Cl.
CPC .............. *H01L 24/11* (2013.01); *H01L 24/13* (2013.01); *H01L 24/20* (2013.01); *H01L 24/81* (2013.01); *H01L 24/96* (2013.01); *H01L 24/97* (2013.01); *H01L 2224/2101* (2013.01); *H01L 2924/37001* (2013.01)

(58) Field of Classification Search
CPC ..... H01L 23/3121; H01L 24/11; H01L 24/13; H01L 24/20; H01L 24/81; H01L 24/96; H01L 24/97; H01L 24/19; H01L 2224/2101; H01L 2924/37001
USPC .......................... 257/787; 438/112, 124, 127
See application file for complete search history.

SEMICONDUCTOR PACKAGE INCLUDING WORKPIECE AND METHOD FOR FABRICATING THE SEMICONDUCTOR PACKAGE

CROSS-REFERENCE TO RELATED APPLICATIONS

The present disclosure claims priority to a Chinese patent application No. CN202010393127.X, entitled "Semiconductor Package And Method For Fabricating The Semiconductor Package" and filed on May 11, 2020 at the CNIPA, the content of which is incorporated herein by reference in its entirety.

TECHNICAL FIELD

The present disclosure relates to the technical field of semiconductor package and, in particular, to a semiconductor package and a method for fabricating the semiconductor package.

BACKGROUND

With the development of advanced technologies such as artificial intelligence, 5th-Generation (5G) technology and smart phones, the semiconductor processes are becoming increasingly demanding, thereby driving and promoting the development of the semiconductor industry.

In the semiconductor technology, the semiconductor package technology plays an important role in the development of the semiconductor industry. It is necessary to achieve smaller physical dimensions, less weight, less thickness, more pins, higher reliability and lower cost for a semiconductor package. In order to meet the requirements of the advanced technologies, a Fan-Out Wafer-Level Packaging (FOWLP) technology is mostly used in the related art. However, the FOWLP technology occupies a large amount of production capacity and has a high cost.

SUMMARY

The present disclosure provides a semiconductor package and a method for fabricating the semiconductor package to reduce the cost of the semiconductor package while meeting the high precision requirement.

An embodiment of the present disclosure provides a method for fabricating a semiconductor package. The method includes steps described below.

A first workpiece is provided, where the first workpiece includes a first substrate and multiple first rewiring structures arranged on the first substrate at intervals, and each of the multiple first rewiring structures includes at least two first rewiring layers.

An encapsulation layer is formed on the multiple first rewiring structures, where the encapsulation layer is provided with multiple first through holes, and the multiple first through holes exposes one first rewiring layer.

At least two second rewiring layers are disposed on a side of the encapsulation layer facing away from the multiple first rewiring structures, where the at least two second rewiring layers are electrically connected to the exposed first rewiring layer.

Multiple semiconductor elements are provided, and the multiple semiconductor elements are arranged on a side of the multiple first rewiring structures facing away from the encapsulation layer, where the at least two first rewiring layers are electrically connected to pins of the multiple semiconductor elements.

An embodiment of the present disclosure provides a semiconductor package. The semiconductor package includes at least two first rewiring layers, an encapsulation layer, second rewiring layers and a semiconductor element.

The encapsulation layer is located on a side of the at least two first rewiring layers, where the encapsulation layer coats the at least two first rewiring layers.

The second rewiring layers are located on a side of the encapsulation layer facing away from the at least two first rewiring layers, where the second rewiring layers are electrically connected to the at least two first rewiring layers through first through holes penetrating through the encapsulation layer.

The semiconductor element includes multiple pins, where the semiconductor element is located on a side of the at least two first rewiring layers facing away from the encapsulation layer, and the multiple pins of the semiconductor element are electrically connected to the at least two first rewiring layers.

In a first aspect, in the embodiments of the present disclosure, the semiconductor elements are arranged on the fabricated first rewiring layers and the fabricated second rewiring layers, that is to say, only the semiconductor elements may be fabricated on a wafer, so that the utilization of the wafer is increased, and the material cost is reduced.

In a second aspect, in the embodiments of the present disclosure, the semiconductor elements are arranged on the fabricated first rewiring layers and the fabricated second rewiring layers, and even if a sliver, poor contact, abnormal short circuit or the like occurs in the first rewiring layers and the second rewiring layers during the fabricating process, damage and waste of the semiconductor elements can not be caused. Therefore, in the embodiments of the present disclosure, the fabricating failure of the entire wafer caused by the fabricating failure of the rewiring layers does not occur, so that the yield of the semiconductor package is improved.

In a third aspect, in the embodiments of the present disclosure, the semiconductor elements are arranged on the fabricated first rewiring layers and the fabricated second rewiring layers, and due to the fact that offsets and errors exist in the process of fabricating the first rewiring layers and the second rewiring layers, a fine adjustment may be performed according to the offsets and errors of the first rewiring layers and the second rewiring layers in the embodiments of the present disclosure, so that the yield of the semiconductor package is improved.

In a fourth aspect, by adopting the embodiments of the present disclosure, the first rewiring structures and the semiconductor elements may be fabricated by a wafer-level process, and then the second rewiring layers are fabricated and electrically connected to the semiconductor elements by a panel-level process, which is conducive to combining the high precision the wafer-level process and the low cost of the panel-level process. The advantages of both the wafer-level process and the panel-level process are combined to implement the fabrication of the semiconductor package, which is conducive to improving the high precision of the semiconductor package, and reducing the cost of the semiconductor package.

In a fifth aspect, by adopting the embodiments of the present disclosure, the first rewiring structures and the semiconductor elements may be fabricated by the wafer-level process, then the second rewiring layers are fabricated and electrically connected to the semiconductor elements by the panel-level process. Compared with the wafer-level process, the fabrication in the panel-level process can be performed on a larger substrate. Therefore, more semiconductor packages can be simultaneously fabricated in one process, which is beneficial to reducing the fabricating cost.

In summary, the embodiments of the present disclosure implement low cost and high yield on the basis of high precision.

DETAILED DESCRIPTION

Figure 1:
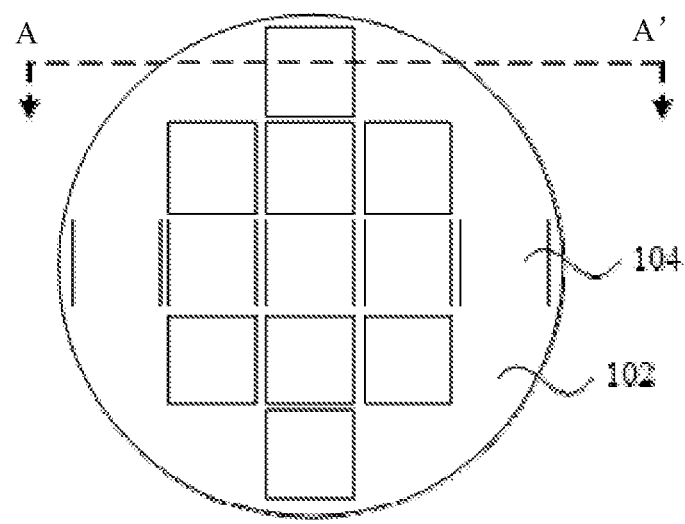
FIG. 1 is a top view of an existing wafer.

The present disclosure will be further described hereinafter in detail with reference to the drawings and embodiments. It should be understood that the embodiments described herein are merely used for explaining the present disclosure and are not intended to limit the present disclosure. It should also be noted that, for ease of description, only part, but not all, of the structures related to the present disclosure are shown in the drawings.

First, an existing method for fabricating a semiconductor package will be described. FIG. 1 is a top view of an existing wafer. Referring to FIG. 1, a wafer 102 is patterned to form multiple semiconductor elements, and multiple rewiring layers 104 are directly fabricated on the semiconductor elements. Since the semiconductor elements are covered by the multiple rewiring layers 104, only a reference numeral of the rewiring layers is denoted in FIG. 1.

Figure 2:
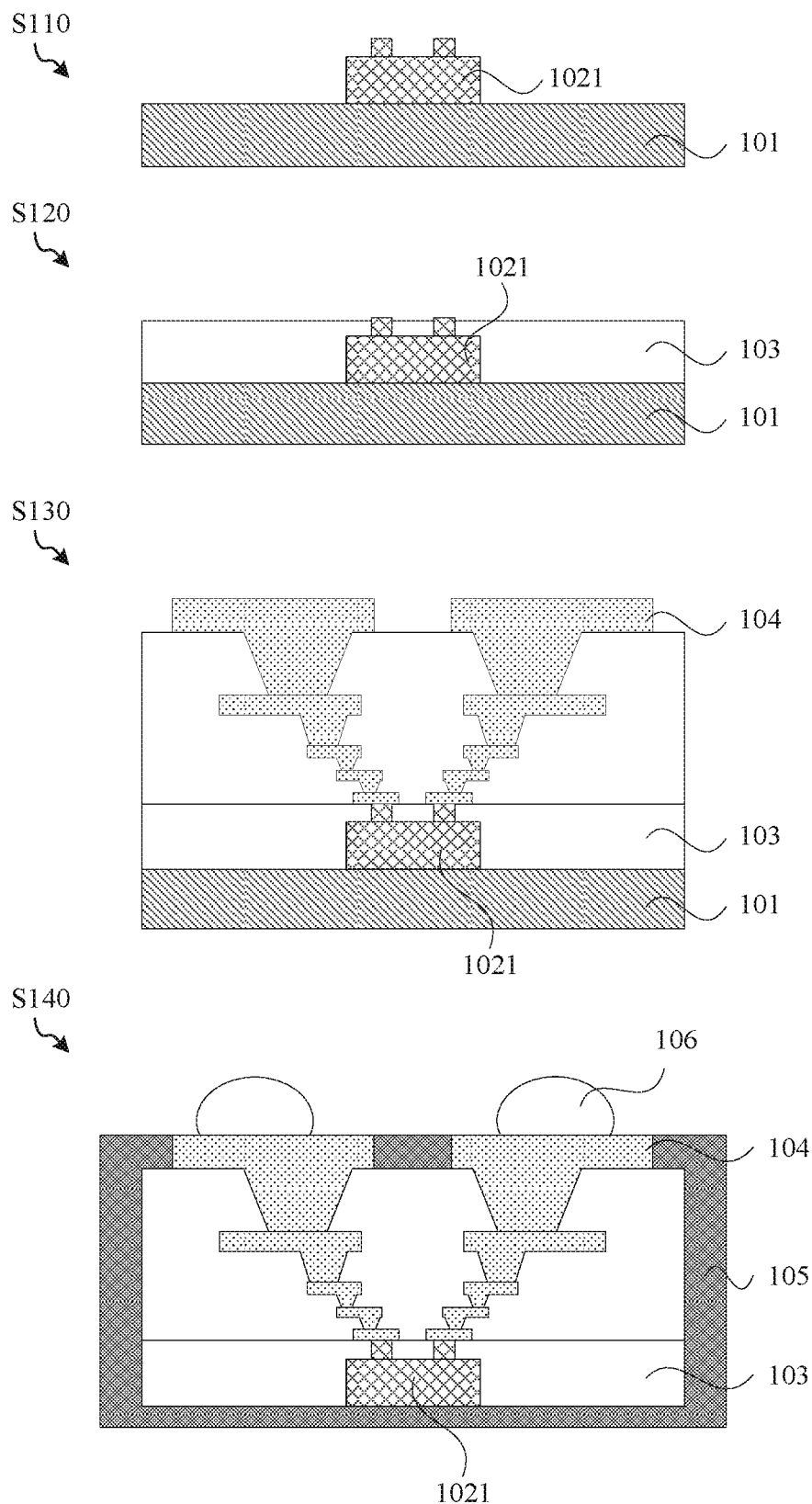
FIG. 2 is a cross-sectional view taken along A-A' of FIG. 1 illustrating a semiconductor package formed by steps of an existing method for fabricating the semiconductor package.

FIG. 2 is a cross-sectional view taken along A-A' of FIG. 1 illustrating a semiconductor package formed by steps of an existing method for fabricating the semiconductor package. The structures of the semiconductor package formed by steps in FIG. 2 are cross-sectional structures taken along A-A' of FIG. 1. Referring to FIGS. 1 and 2, the existing method for fabricating the semiconductor package includes steps described below.

In S110, multiple semiconductor elements 1021 are formed on a substrate 101.

In S120, the semiconductor elements 1021 are plastic encapsulated to form a first plastic encapsulation layer 103, and the first plastic encapsulation layer 103 is grinded to expose pins of the semiconductor elements 1021.

In S130, multiple rewiring layers 104 with high to low precisions are fabricated on the semiconductor elements 1021 in sequence.

In S140, the substrate 101 is removed, the semiconductor elements 1021 and the multiple rewiring layers 104 are plastic encapsulated to form a second plastic encapsulation layer 105, and balls are implanted to form solder balls 106.

The existing method for fabricating the semiconductor package has higher cost. The reason is that, in the related art, it is necessary to use a wafer-level process to directly and sequentially fabricate the multiple rewiring layers 104 on the wafer 102. In a first aspect, the wafer 102 is used for fabricating wires of the semiconductor elements 1021, and the rewiring layers 104 are fabricated on the semiconductor elements 1021 by a process such as a copper plating process; and the size of the rewiring layer 104 with a low precision is larger than that of the semiconductor element 1021, so that the rewiring layer 104 with the low precision occupies a large area of the wafer, thus the utilization of the wafer 102 is lower. Therefore, the rewiring layer 104 with the low precision occupies a larger production capacity of the wafer-level process. In a second aspect, in the process of fabricating the multiple rewiring layers 104 in sequence, a sliver or a distortion may occur, which results in the damage and waste of the entire wafer 102 located below the rewiring layers 104, and results in lower yield of the semiconductor package. Therefore, the existing method for fabricating the semiconductor package has higher cost.

Figure 3:
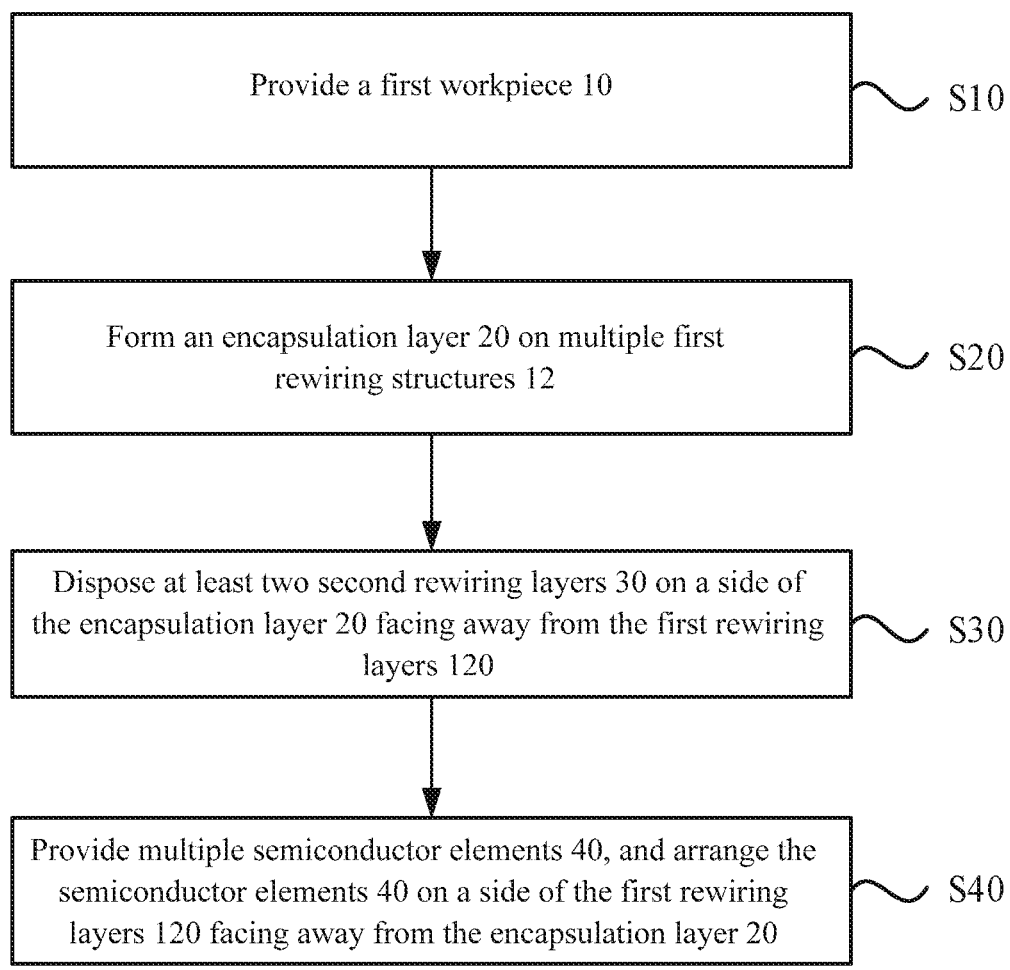
FIG. 3 is a flowchart of a method for fabricating a semiconductor package according to an embodiment of the present disclosure.
Figure 4:
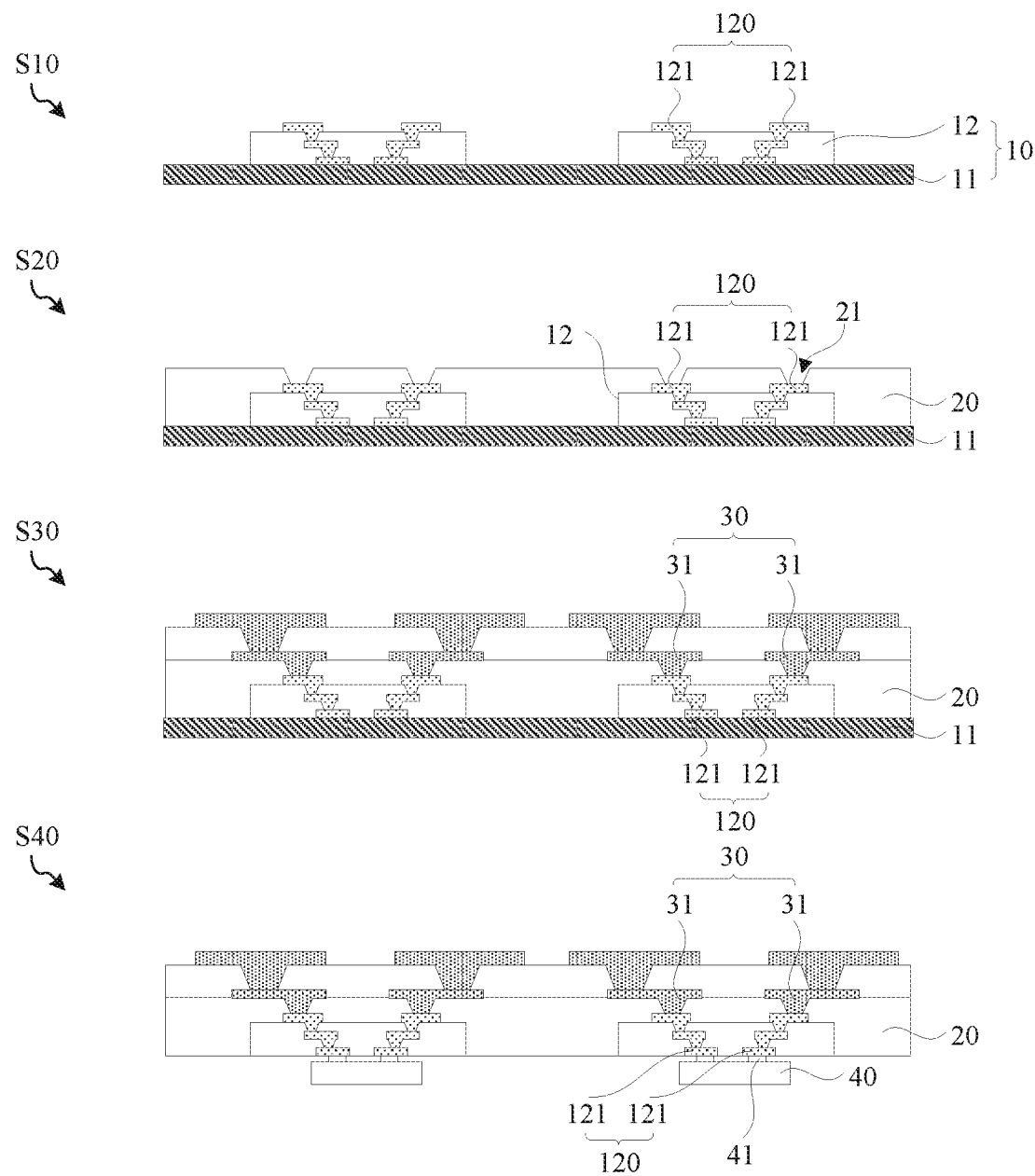
FIG. 4 is a schematic diagram illustrating structures formed by steps of a method for fabricating a semiconductor package according to an embodiment of the present disclosure.

An embodiment of the present disclosure provides a method for fabricating a semiconductor package, which is suitable for fabricating a multi-pin semiconductor package. FIG. 3 is a flowchart of a method for fabricating a semiconductor package according to an embodiment of the present disclosure, and FIG. 4 is a schematic diagram illustrating structures formed by steps of a method for fabricating a semiconductor package according to an embodiment of the present disclosure. Referring to FIGS. 3 and 4, the method for fabricating the semiconductor package includes steps described below.

In S10, a first workpiece 10 is provided.

The first workpiece 10 includes a first substrate 11 and multiple first rewiring structures 12 arranged on the first substrate 11 at intervals. The first rewiring structure 12 includes at least two first rewiring layers 120. The first substrate 11 may be, for example, a glass or a copper foil. In an embodiment, the first substrate 11 may be suitable for being used in a panel-level process. Compared with a substrate in a wafer-level process, the substrate in the panel-level process has a larger size, for example, the size is 300 mm*300 mm or larger. Therefore, the use of the panel-level process is beneficial to implementing the fabrication of more semiconductor packages on the basis of a larger substrate.

In an embodiment, each first rewiring layer 120 includes a first wire part 121. The first wire part 121 is used for an electrical connection with pins of a semiconductor element and for an electrical connection between the first rewiring layers 120. FIG. 4 exemplarily shows that the number of the first rewiring layers 120 is three, and the number of the first rewiring layers 120 may also be two, four, five, or more, which may be determined according to the size of the semiconductor package, the size of the semiconductor element, and the process precision in practical applications.

Exemplarily, the first rewiring layers 120 are high-precision rewiring layers, and the minimum wire width of the first rewiring layers 120 may be, for example, less than 5 um, 4 um, 3 um, 2 um, 1 um, 0.5 um, or less. The first rewiring structures 12 may be fabricated by the wafer-level process to meet the requirement of high precision. The first rewiring structures 12 may also be fabricated by the panel-level process with high precision, which is not limited in the present disclosure.

In S20, an encapsulation layer 20 is formed on the first rewiring structures 12.

The encapsulation layer 20 is provided with multiple first through holes 21, and the first through holes 21 expose one first rewiring layer 120. The encapsulation layer 20 covers the first rewiring structures 12 so that the structure on the first rewiring structures 12 is flat, which is beneficial to the fabrication in subsequent processes. In an embodiment, a material of the encapsulation layer 20 includes at least one of following insulating materials: polyimide, liquid crystal polymer or acrylic, to play a good insulating role.

In S30, at least two second rewiring layers 30 are disposed on a side of the encapsulation layer 20 facing away from the first rewiring layers 120.

The second rewiring layers 30 are electrically connected to the exposed first rewiring layer 120. The second rewiring layer 30 is similar to the first rewiring layer 120 in structure and function. The second rewiring layer 30 is used for an electrical connection with the first rewiring layer 120, and for an electrical connection between the second rewiring layers 30. In an embodiment, the second rewiring layer 30 includes a second wire part 31, the first wire part 121 of the first rewiring layer 120 with the shortest distance to one of the at least two second rewiring layers 30 is electrically connected to the second wire part 31 of the one of the at least two second rewiring layers 30. FIG. 3 exemplarily shows that the number of the second rewiring layers 30 is two, and the number of the second rewiring layers 30 may also be three, four, five, or more, which may be determined according to the size of the semiconductor package, the size of a semiconductor element 40, and the process precision in practical applications.

The second rewiring layers 30 are different from the first rewiring layers 120 in that the minimum wire width of the second rewiring layers 30 is different from the minimum wire width of the first rewiring layers 120. Exemplarily, the minimum wire width of the first rewiring layers 120 is less than the minimum wire width of the second rewiring layers. In an embodiment, the first rewiring layers 120 are high-precision rewiring layers, and the minimum wire width of the first rewiring layers 120 may be, for example, less than 5 um, 4 um, 3 um, 2 um, 1 um, 0.5 um, or less. Correspondingly, the second rewiring layers 30 are low-precision rewiring layers, and the minimum wire width of the second rewiring layers 30 may be, for example, greater than or equal to 5 um, 4 um, 3 um, 2 um, 1 um, 0.5 um, or other sizes. Exemplarily, for the existing panel-level process, a wire width of 5 um may be achieved, so that the second rewiring layer 30 with the minimum wire width of 5 um may be fabricated by the panel-level process, and the cost may be reduced compared with the wafer-level process.

In S40, multiple semiconductor elements 40 are provided, and the semiconductor elements 40 are arranged on a side of the first rewiring layers 120 facing away from the encapsulation layer 20.

The first rewiring layers 120 are electrically connected to pins 41 of the semiconductor elements 40. The first wire part 121 of the first rewiring layer 120 with the shortest distance to a corresponding semiconductor element 40 is electrically connected to the pins 41 of the corresponding semiconductor element 40. Exemplarily, the electrical connection between the semiconductor elements 40 and the first rewiring layers 120 may be achieved by a bonding process or a crimping process. It should be understood that before the semiconductor elements 40 are arranged on the side of the first rewiring layers 120 facing away from the encapsulation layer 20, the first substrate 11 needs to be removed to expose the first rewiring layer 120 so as to facilitate the electrical connection between the semiconductor elements 40 and the first rewiring layers 120.

The semiconductor element 40 refers to a die made of the wafer by the wafer-level process. As can be seen from FIG. 4, the first rewiring layer 120 with the shortest distance to the corresponding semiconductor element 40 has the minimum wire width and the highest precision, and the first rewiring layer 120 and the second rewiring layer 30 farther from the semiconductor elements 40 have the larger wire width and the lower precision. Therefore, the size of the semiconductor element 40 is less than the sizes of the first rewiring layers 120 and the sizes of the second rewiring layers 30, that is, the size of the semiconductor element 40 is less than the size of the semiconductor package.

Figure 5:
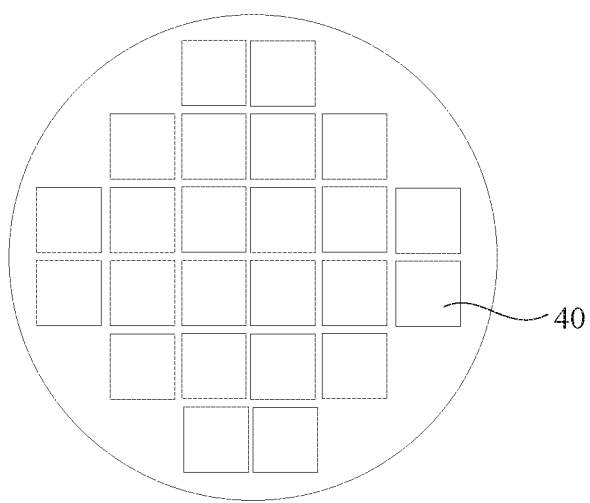
FIG. 5 is a structural diagram of a semiconductor element located on a wafer according to an embodiment of the present disclosure.

FIG. 5 is a structural diagram of a semiconductor element located on a wafer according to an embodiment of the present disclosure. With reference to FIGS. 1 and 5, after the wafer 102 is patterned to form semiconductor elements in the existing semiconductor package, the multiple rewiring layer 104 are directly fabricated on the wafer 102. Since the size of the rewiring layer 104 is larger than that of the semiconductor element, a position of the rewiring layer needs to be reserved in the process of fabricating the semiconductor elements, and the number of the semiconductor elements fabricated by the wafer 102 is less. As can be seen from S10 to S40, the semiconductor elements 40 are arranged on the fabricated first rewiring layers 120 and the second rewiring layers 30 in the embodiments of the present disclosure. That is to say, when the semiconductor elements 40 are formed on the wafer, the position of the rewiring layer does not need to be reserved, so that the semiconductor elements 40 can be fabricated only on the wafer. Thus, the utilization of the wafer is increased.

In a first aspect, in the embodiments of the present disclosure, the semiconductor elements 40 are arranged on the fabricated first rewiring layers 120 and the fabricated second rewiring layers 30, that is to say, when the semiconductor elements 40 are formed on the wafer, the position of the rewiring layer does not need to be reserved, so that more semiconductor elements can be formed on the wafer. Thus, the utilization of the wafer is increased, and the material cost is reduced.

In a second aspect, in the embodiments of the present disclosure, the semiconductor elements 40 are arranged on the fabricated first rewiring layers 120 and the fabricated second rewiring layers 30, and even if a sliver, poor contact, abnormal short circuit or the like occurs in the first rewiring layers 120 and the second rewiring layers 30 during the fabricating process, damage and waste of the semiconductor elements 40 can not be caused. Therefore, in the embodiments of the present disclosure, the fabricating failure of the entire wafer caused by the fabricating failure of the rewiring layers does not occur, so that the yield of the semiconductor package is improved.

In a third aspect, in the embodiments of the present disclosure, the semiconductor elements 40 are arranged on the fabricated first rewiring layers 120 and the fabricated second rewiring layers 30, and due to the fact that offsets and errors exist in the process of fabricating the first rewiring layers 120 and the second rewiring layers 30, a fine adjustment may be performed according to the offsets and errors of the first rewiring layers 120 and the second rewiring layers 30 in the embodiments of the present disclosure, so that the yield of the semiconductor package is improved.

In a fourth aspect, by adopting the embodiments of the present disclosure, the first rewiring structures 12 and the semiconductor elements 40 may be fabricated by the wafer-level process, and then the second rewiring layers 30 are fabricated and electrically connected to the semiconductor elements 40 by the panel-level process, which is conducive to combining the high precision of the wafer-level process and the low cost of the panel-level process. The advantages of both the wafer-level process and the panel-level process are combined to implement the fabrication of the semiconductor package, which is conducive to improving the high precision of the semiconductor package, and reducing the cost of the semiconductor package.

In a fifth aspect, by adopting the embodiments of the present disclosure, the first rewiring structures 12 and the semiconductor elements 40 may be fabricated by the wafer-level process, then the second rewiring layers 30 are fabricated and electrically connected to the semiconductor elements 40 by the panel-level process. Compared with the wafer-level process, the fabrication in the panel-level process can be performed on a larger substrate. Therefore, more semiconductor packages can be simultaneously fabricated in one process, which is beneficial to reducing the fabricating cost.

In summary, the embodiments of the present disclosure implement low cost and high yield on the basis of high precision.

Based on the foregoing embodiments, an embodiment of the present disclosure further provides refinement steps and supplementary steps of the foregoing steps.

On the basis of the foregoing embodiments, in an embodiment, after the semiconductor elements 40 are arranged on the side of the first rewiring layers 120 facing away from the encapsulation layer 20, the method further includes a following step: the semiconductor elements 40 are plastically encapsulated. There are many ways of plastically encapsulating the semiconductor elements 40, and several of them are described below, but not as limitations of the present disclosure.

Figure 6:
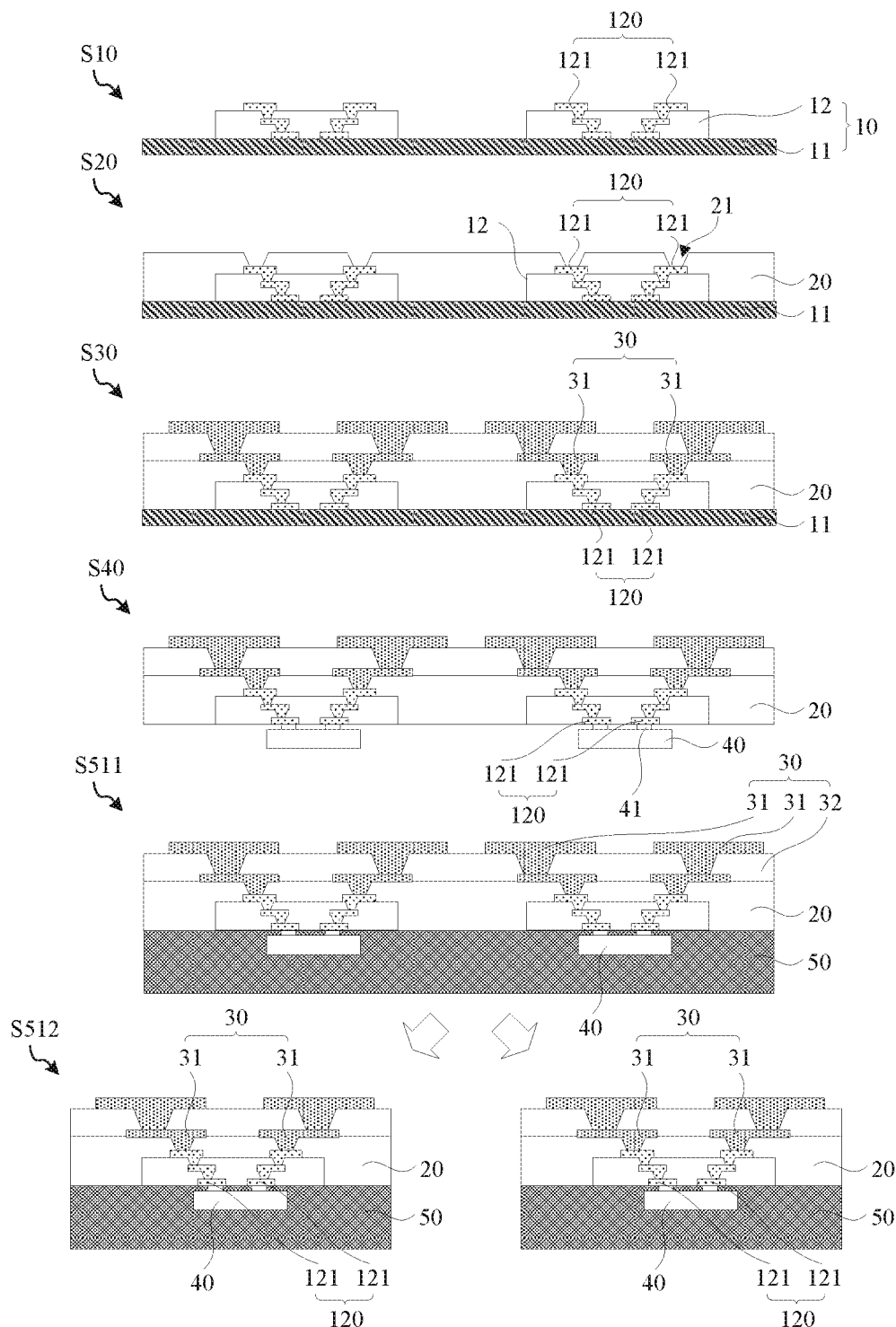
FIG. 6 is a schematic diagram illustrating structures formed by steps of another method for fabricating a semiconductor package according to an embodiment of the present disclosure.

FIG. 6 is a schematic diagram illustrating structures formed by steps of another method for fabricating a semiconductor package according to an embodiment of the present disclosure. Referring to FIG. 6, in an embodiment, a plastic encapsulation method after S40 includes steps described below.

In S511, a plastic encapsulation layer 50 is formed on a side of the semiconductor elements 40 facing away from the second rewiring layers 30. The plastic encapsulation layer 50 coats the semiconductor elements 40.

A material of the plastic encapsulation layer 50 includes an epoxy mold compound (EMC). Exemplarily, the encapsulation layer 50 is formed by an injection molding process. The plastic encapsulation layer 50 may protect the semiconductor elements 40 and provide a heat dissipation path for the semiconductor elements 40. It should be noted that FIG. 6 exemplarily shows that the semiconductor elements 40 are plastically encapsulated when the semiconductor elements 40 are located below, which is not a limitation of the present disclosure. In other embodiments, a flip may be performed first to enable the semiconductor elements 40 to be located above and the semiconductor elements 40 are plastically encapsulated.

In S512, the encapsulation layer 20, the second rewiring layers 30 and the plastic encapsulation layer 50 are cut.

The second rewiring layers 30 include second wire parts 31 and a second insulating layer 32. The cutting of the second rewiring layers 30 may refer to the cutting of the second insulating layer 32. In the embodiment of the present disclosure, a plastic encapsulation process is first performed in S511, and then a cutting process is performed in S512, so that the edges of the plastic encapsulation layer 50 and the encapsulation layer 20 of the formed semiconductor package are aligned. In addition, a process of first plastic encapsulating and then cutting is used, and the plastic encapsulation layer 50 may be used for forming a support, which is beneficial to maintaining the rigidity of the semiconductor package in the cutting process, and performing the cutting process.

Figure 7:
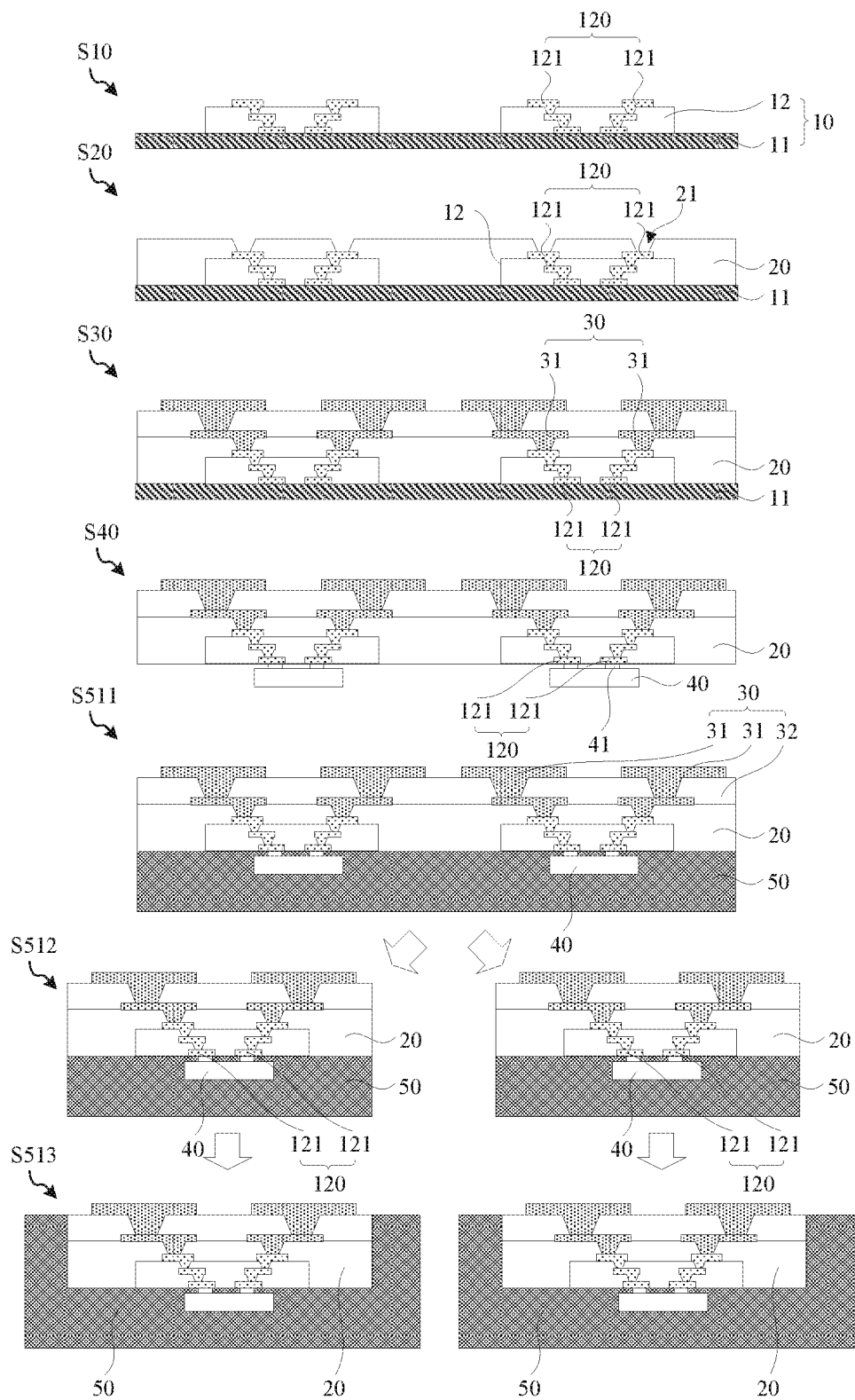
FIG. 7 is a schematic diagram illustrating structures formed by steps of another method for fabricating a semiconductor package according to an embodiment of the present disclosure.

FIG. 7 is a schematic diagram illustrating structures formed by steps of another method for fabricating a semiconductor package according to an embodiment of the present disclosure. Referring to FIG. 7, in an embodiment, after S512, the method further includes steps described below.

In S513, a plastic encapsulation layer 50 is formed on side surfaces of the encapsulation layer 20 and side surfaces of the second rewiring layers 30.

Exemplarily, the material and process of the plastic encapsulation layer for side edge plastic encapsulation in S513 is the same as the material and process of the plastic encapsulation layer 50 formed in S511. Therefore, the plastic encapsulation layers formed in S511 and S513 may be regarded as a whole. According to the embodiment of the present disclosure, the plastic encapsulation area of the plastic encapsulation layer 50 is increased through the side edge plastic encapsulation, so that not only the protection and heat dissipation of the semiconductor elements 40 may be achieved, but also the encapsulation layer 20 and the second rewiring layers 30 may be protected. Thus the protection performance and the heat dissipation performance of the semiconductor package are enhanced.

Figure 8:
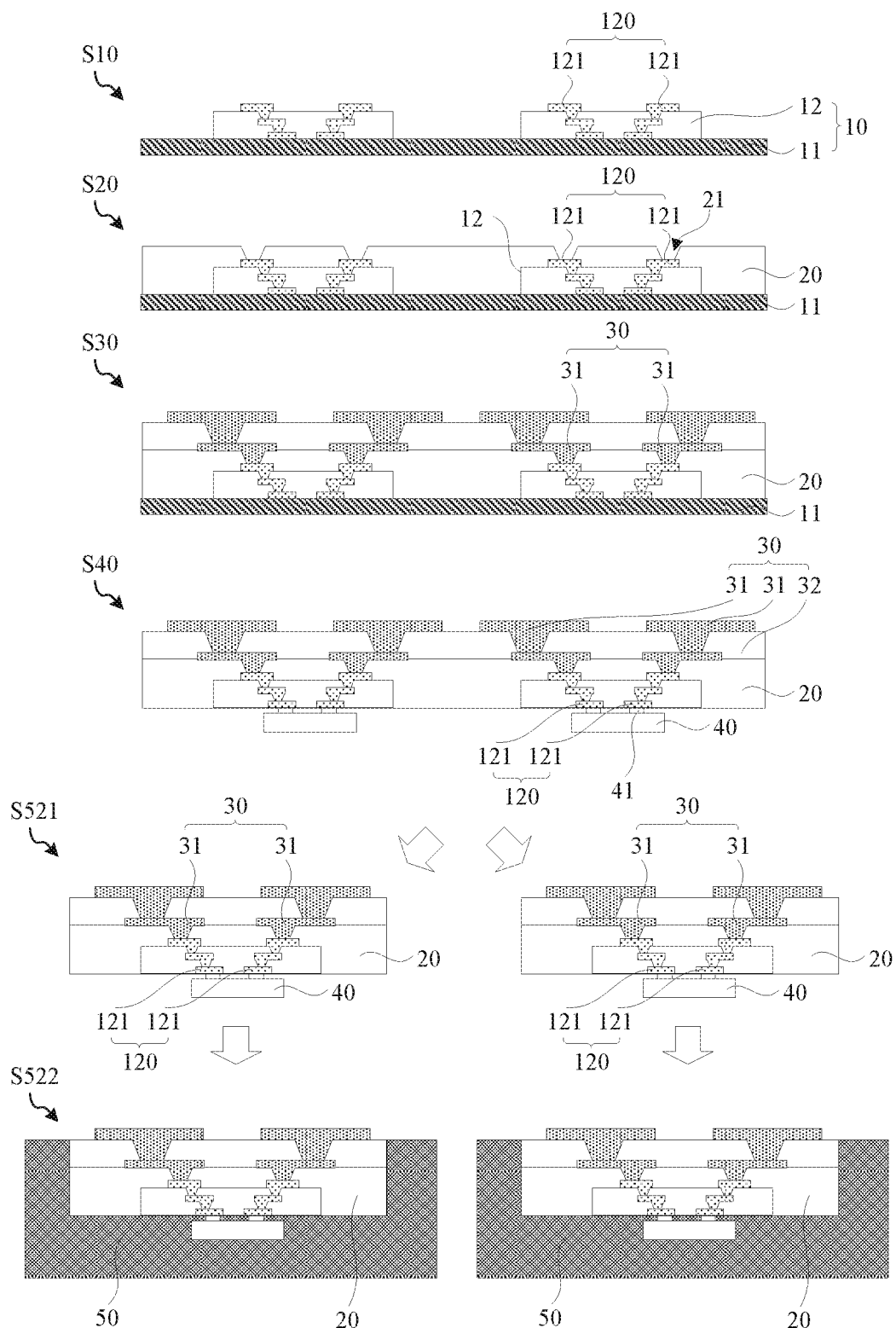
FIG. 8 is a schematic diagram illustrating structures formed by steps of another method for fabricating a semiconductor package according to an embodiment of the present disclosure.

FIG. 8 is a schematic diagram illustrating structures formed by steps of another method for fabricating a semiconductor package according to an embodiment of the present disclosure. Referring to FIG. 8, in an embodiment, a plastic encapsulation method after S40 includes steps described below.

In S521, the encapsulation layer 20 and the second rewiring layers 30 are cut.

The second rewiring layers 30 include second wire parts 31 and a second insulating layer 32. The cutting of the second rewiring layers 30 may refer to the cutting of the second insulating layer 32.

In S522, the plastic encapsulation layer 50 is formed on a side of the semiconductor elements 40 facing away from the second rewiring layers 30. The plastic encapsulation layer 50 coats the semiconductor element 40, side surfaces of the encapsulation layer 20, and side surfaces of the second rewiring layers 30.

A material of the plastic encapsulation layer 50 includes an EMC. Exemplarily, the plastic encapsulation layer 50 is formed by an injection molding process. The plastic encapsulation layer 50 protects the semiconductor element 40, the encapsulation layer 20 and the second rewiring layers 30, and provides a heat dissipation path for the semiconductor element 40.

Different from the method for fabricating the semiconductor package shown in FIG. 7, in the embodiment of the present disclosure, the cutting process is first performed in S521, and then the plastic encapsulation process is performed in S522, that is, in the embodiment of the present disclosure, the plastic encapsulation and the side edge plastic encapsulation of the semiconductor elements 40 may be completed only by performing the plastic encapsulation process once but not performing the plastic encapsulation process twice, so that the steps of the plastic encapsulation process may be simplified in the embodiment of the present disclosure.

Figure 9:
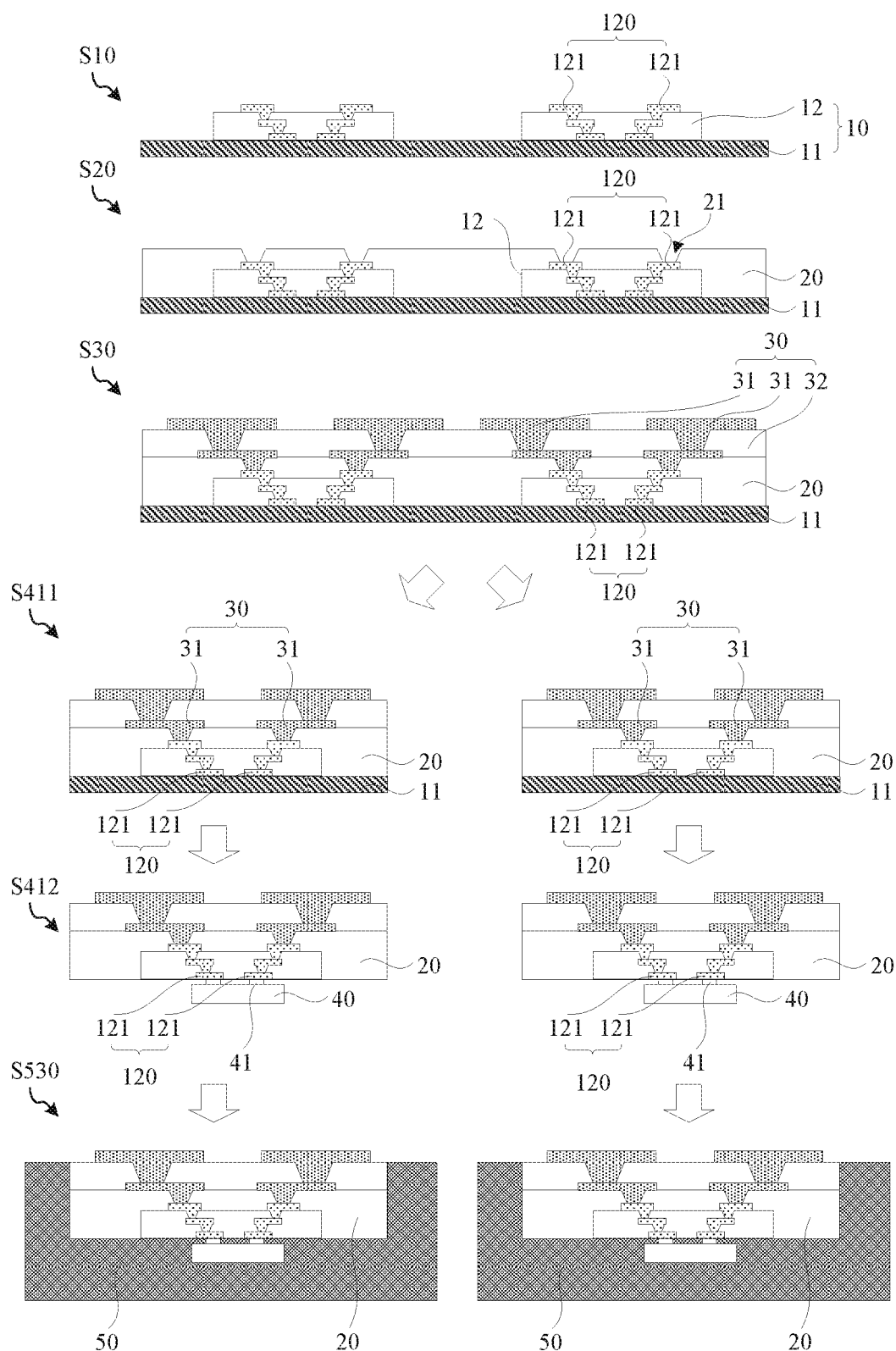
FIG. 9 is a schematic diagram illustrating structures formed by steps of another method for fabricating a semiconductor package according to an embodiment of the present disclosure.

FIG. 9 is a schematic diagram illustrating structures formed by steps of another method for fabricating a semiconductor package according to an embodiment of the present disclosure. Referring to FIG. 9, in an embodiment, the method for fabricating the semiconductor package includes steps described below.

In S10, a first workpiece 10 is provided.

In S20, an encapsulation layer 20 is formed on first rewiring structures 12.

In S30, at least two second rewiring layers 30 are disposed on a side of the encapsulation layer 20 facing away from the first rewiring layers 120.

In S411, the encapsulation layer 20 and the second rewiring layers 30 are cut.

The second rewiring layers 30 include second wire parts 31 and a second insulating layer 32. The cutting of the second rewiring layers 30 may refer to the cutting of the second insulating layer 32.

In S412, multiple semiconductor elements 40 are provided, and the semiconductor elements 40 are arranged on a side of the first rewiring layers 120 facing away from the encapsulation layer 20.

The first rewiring layers 120 are electrically connected to pins 41 of the semiconductor elements 40.

In S530, a plastic encapsulation layer 50 is formed on a side of the semiconductor element 40 facing away from the second rewiring layers 30. The plastic encapsulation layer 50 coats the semiconductor element 40, side surfaces of the encapsulation layer 20, and side surfaces of the second rewiring layers 30.

A material of the plastic encapsulation layer 50 includes an EMC. Exemplarily, the plastic encapsulation layer 50 is formed by an injection molding process. The plastic encapsulation layer 50 protects the semiconductor element 40, the encapsulation layer 20 and the second rewiring layers 30, and provides a heat dissipation path for the semiconductor element 40.

Different from the methods for fabricating the semiconductor package shown in FIGS. 6 to 8, in the embodiment of the present disclosure, the cutting process is performed before the semiconductor elements 40 are bonded, therefore the first substrate 11 may be used for forming a support in S411, which is beneficial to maintaining the rigidity of the semiconductor package in the cutting process, and cutting. Moreover, in the embodiment of the present disclosure, the plastic encapsulation and the side edge plastic encapsulation of the semiconductor element 40 may be completed only by performing the plastic encapsulation process once but not performing the plastic encapsulation process twice, so that the steps of the plastic encapsulation process may be simplified in the embodiment of the present disclosure.

On the basis of the embodiments described above, in an embodiment, the method for fabricating the semiconductor plastic encapsulation further includes a following step: a solder ball group is formed on a side of the second rewiring layers 30 facing away from the semiconductor elements 40. In an embodiment, the step in which the solder ball group is formed may be performed before the semiconductor elements 40 are arranged, before the cutting, or after the plastic encapsulation, and several of these ways of forming the solder ball group are described below, but not as limitations of the present disclosure.

Figure 10:
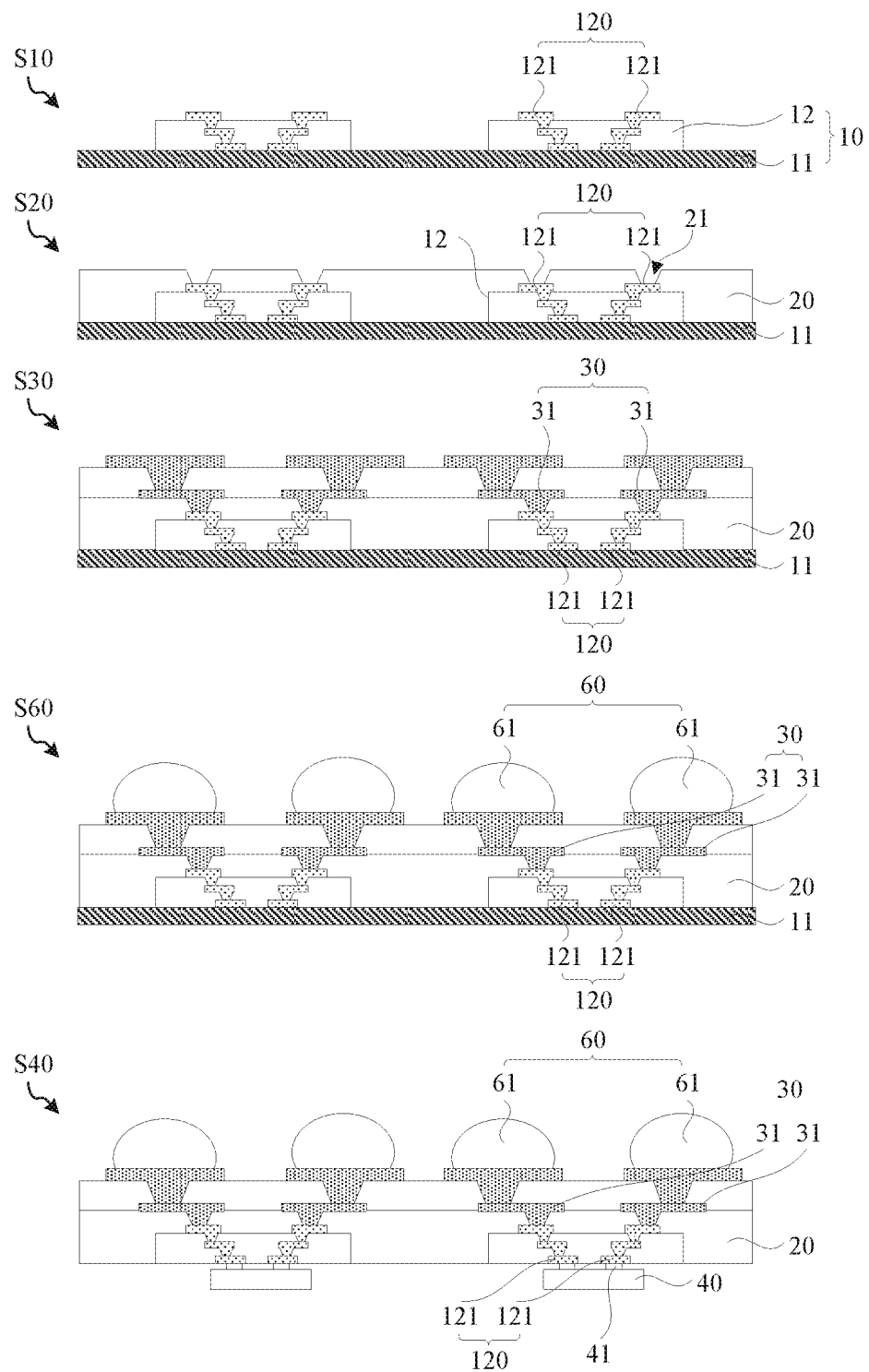
FIG. 10 is a schematic diagram illustrating structures formed by steps of another method for fabricating a semiconductor package according to an embodiment of the present disclosure.

FIG. 10 is a schematic diagram illustrating structures formed by steps of another method for fabricating a semiconductor package according to an embodiment of the present disclosure. Referring to FIG. 10, in an embodiment, the method for fabricating the semiconductor package includes steps described below.

In S10, a first workpiece 10 is provided.

In S20, an encapsulation layer 20 is formed on first rewiring structures 12.

In S30, at least two second rewiring layers 30 are disposed on a side of the encapsulation layer 20 facing away from the first rewiring layers 120.

In S60, a solder ball group 60 is formed on a side of the second rewiring layers 30 facing away from semiconductor elements 40.

The solder ball group 60 includes multiple first solder balls 61, the first solder balls 61 are electrically connected to the second rewiring layers 30, and the first solder balls 61 are used for implementing an electrical connection between pins 41 of the semiconductor elements 40 and an external circuit. The first solder ball 61 may be formed of a metal material including metal such as tin, plumbum, copper, silver, gold, or an alloy thereof. Exemplarily, a printing process, ball implanting, electroplating, a sputtering and the like may be used.

In S40, multiple semiconductor elements 40 are provided, and the semiconductor elements 40 are arranged on a side of the first rewiring layers 120 facing away from the encapsulation layer 20.

In the embodiment of the present disclosure, the step in which the solder ball group is formed may be performed before the semiconductor elements 40 are bonded, so that the semiconductor elements 40 may be prevented from being damaged by high temperature generated in the process of forming the solder ball group 60, the occurrence of a sliver, poor contact or abnormal short circuit in the process of forming the solder ball group 60 may be avoided, and the semiconductor elements 40 may be prevented from being damaged and wasted, thereby facilitating the improvement of the yield of semiconductor package.

Figure 11:
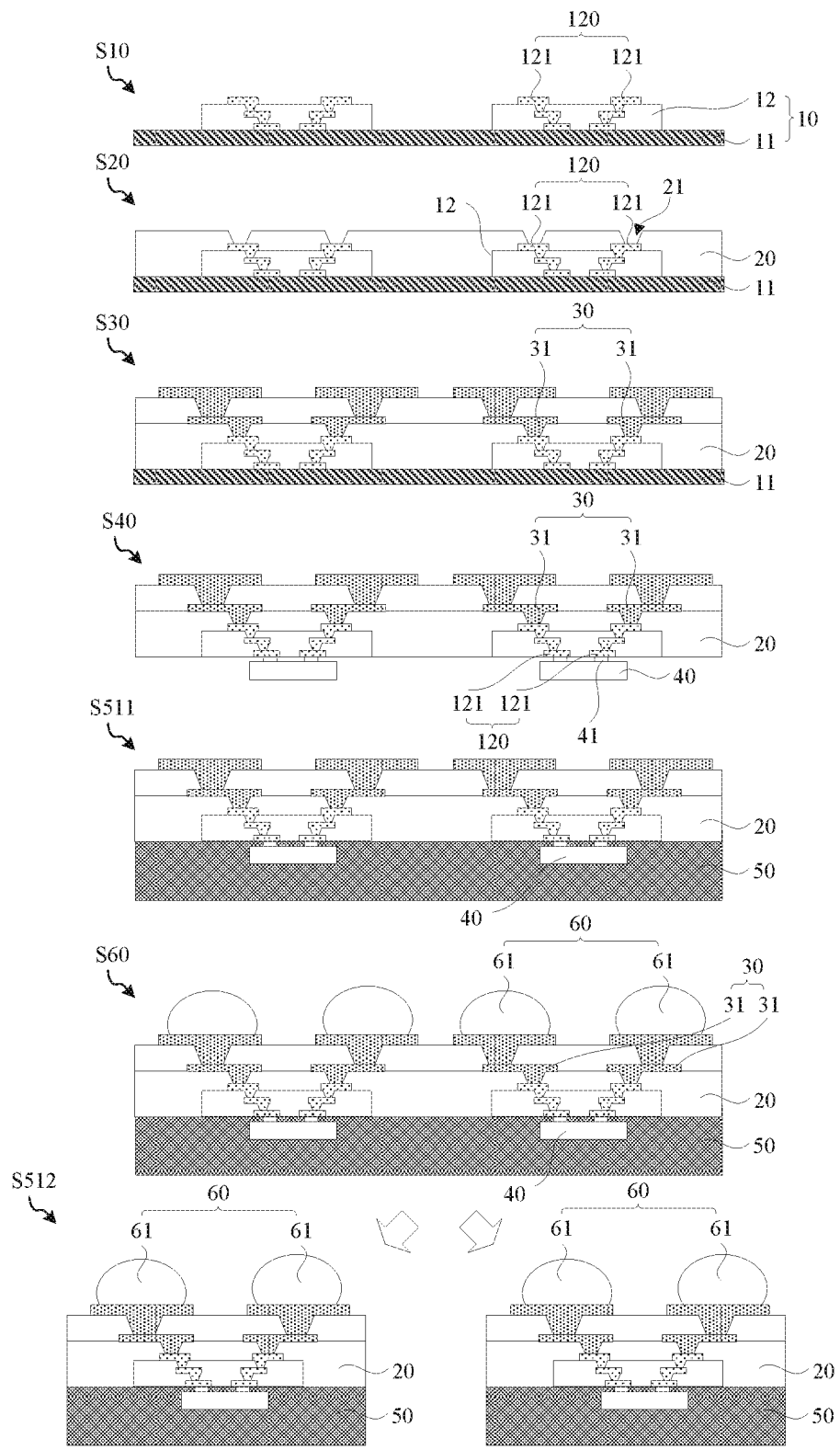
FIG. 11 is a schematic diagram illustrating structures formed by steps of another method for fabricating a semiconductor package according to an embodiment of the present disclosure.

FIG. 11 is a schematic diagram illustrating structures formed by steps of another method for fabricating a semiconductor package according to an embodiment of the present disclosure. Referring to FIG. 11, in an embodiment, the method for fabricating the semiconductor package includes steps described below.

In S10, a first workpiece 10 is provided.

In S20, an encapsulation layer 20 is formed on first rewiring structures 12.

In S30, at least two second rewiring layers 30 are disposed on a side of the encapsulation layer 20 facing away from the first rewiring layers 120.

In S40, multiple semiconductor elements 40 are provided, and the semiconductor elements 40 are arranged on a side of the first rewiring layers 120 facing away from the encapsulation layer 20.

In S511, a plastic encapsulation layer 50 is formed on a side of the semiconductor elements 40 facing away from the second rewiring layers 30, and the plastic encapsulation layer 50 coats the semiconductor elements 40.

In S60, a solder ball group 60 is formed on a side of the second rewiring layers 30 facing away from the semiconductor elements 40.

The solder ball group 60 includes multiple first solder balls 61, the first solder balls 61 are electrically connected to the second rewiring layers 30, and the first solder balls 61 are used for implementing an electrical connection between pins 41 of the semiconductor elements 40 and an external circuit. The first solder ball 61 may be formed of a metal material including metal such as tin, plumbum, copper, silver, gold, or an alloy thereof. Exemplarily, a printing process, ball implanting, electroplating, a sputtering and the like may be used.

Different from the step in which the solder ball group 60 is formed in FIG. 10, in the embodiment of the present disclosure, the step in which the solder ball group 60 is formed is performed after the plastic encapsulation layer 50 is formed. It should be noted that FIG. 11 exemplarily shows that the solder ball group 60 is formed before the cutting process, which is not a limitation of the present disclosure. In other embodiments, the solder ball group 60 may be formed after the cutting process, and may be set as required in practical applications.

On the basis of the embodiments described above, in an embodiment, there are many methods for fabricating the first workpiece 10, and several of them are described below, but not as limitations of the present disclosure.

Figure 12:
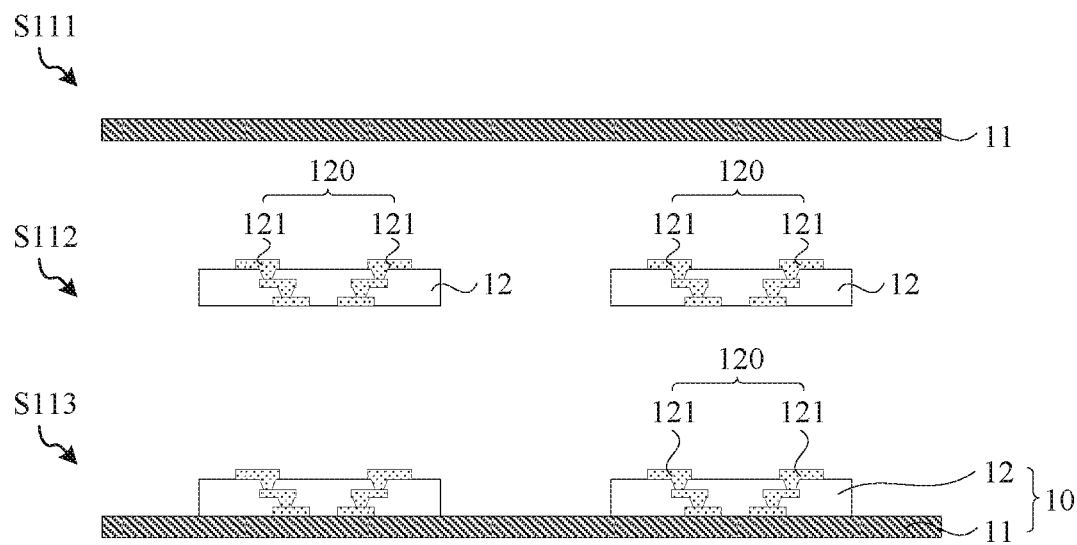
FIG. 12 is a schematic diagram illustrating structures formed by steps of a method for fabricating a first workpiece according to an embodiment of the present disclosure.

FIG. 12 is a schematic diagram illustrating structures formed by steps of a method for fabricating a first workpiece according to an embodiment of the present disclosure. Referring to FIG. 12, in an embodiment, the method for fabricating the first workpiece includes steps described below.

In S111, a first substrate 11 is provided.

The first substrate 11 may be, for example, a glass or a copper foil. In an embodiment, the first substrate 11 may be suitable for use in the panel-level process. Compared with a substrate in the wafer-level process, the substrate in the panel-level process has a larger size, for example the size is 300 mm*300 mm or larger. Therefore, the use of the panel-level process is beneficial to implementing the fabrication of more semiconductor packages on the basis of a larger substrate.

In S112, multiple first rewiring structures 12 are provided.

The first rewiring structures 12 may be fabricated by the wafer-level process to meet the requirement of high precision. The first rewiring structures 12 may also be fabricated by the panel-level process with the high precision, which is not limited in the present disclosure. Exemplarily, the first rewiring structures 12 may be fabricated on the first substrate 11 by a pressing process or an attaching process. The precisions of the first rewiring layers 120 in the first rewiring structure 12 sequentially decrease. In an embodiment, the first rewiring layers 120 are high-precision rewiring layers, and the second rewiring layers are low-precision rewiring layers. The first rewiring layer 120 with the shortest distance to the first substrate 11 is set to have the minimum wire width and the highest precision, and the first rewiring layer 120 farther from the first substrate 11 is set to have the larger wire width and the lower precision, which is beneficial to continue the fabrication of the second rewiring layers on the first substrate 11.

In S113, the multiple first rewiring structures 12 are arranged on the first substrate 11 at intervals.

In the embodiment of the present disclosure, the first rewiring structures 12 may be fabricated by the wafer-level process, and then the multiple first rewiring structures 12 are arranged on the first substrate 11 at intervals by the panel-level process, which is beneficial to combining the high precision of the wafer-level process and the low cost of the panel-level process. The advantages of both the wafer-level process and the panel-level process are combined to implement the fabrication of the semiconductor package, which is beneficial to increasing the high precision of the semiconductor package and to reducing the cost of the semiconductor package.

Figure 13:
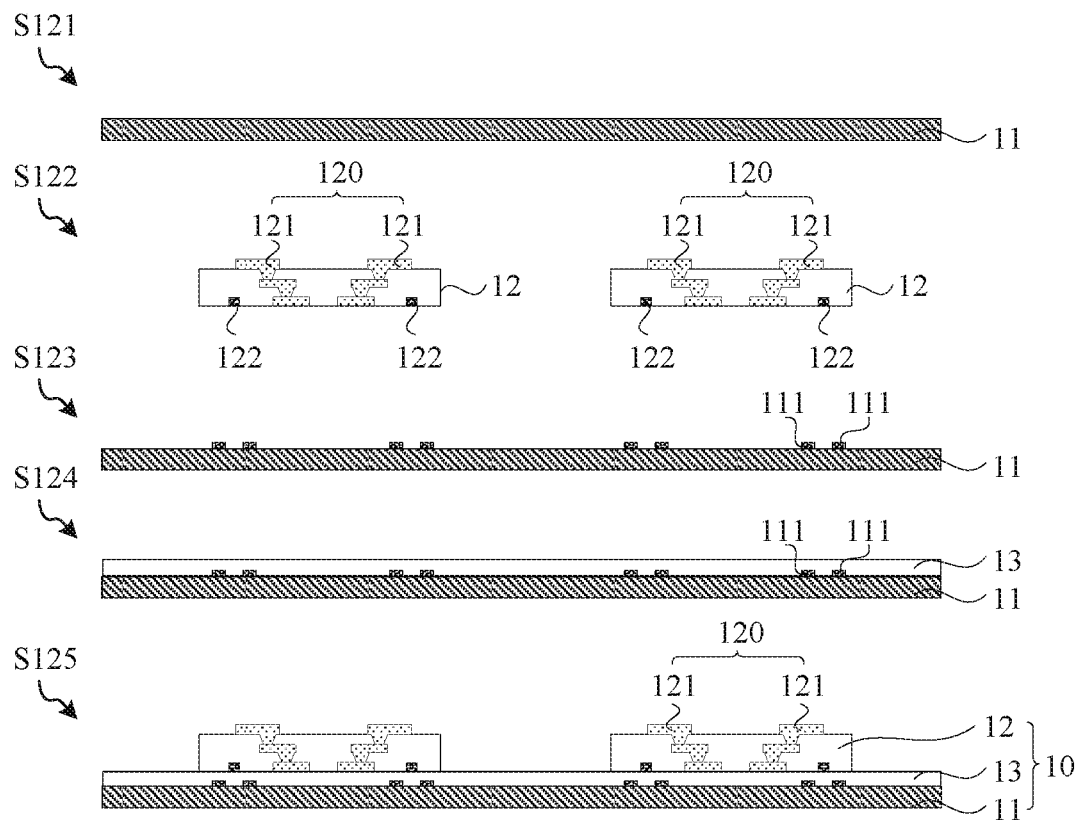
FIG. 13 is a schematic diagram illustrating structures formed by steps of another method for fabricating a first workpiece according to an embodiment of the present disclosure.

FIG. 13 is a schematic diagram illustrating structures formed by steps of another method for fabricating a first workpiece according to an embodiment of the present disclosure. Referring to FIG. 13, in an embodiment, the method for fabricating the first workpiece 10 includes steps described below.

In S121, a first substrate 11 is provided.

In S122, multiple first rewiring structures 12 are provided.

The first rewiring structure 12 further includes a first alignment mark 122, and the first alignment mark 122 is used for marking a position of the first rewiring structure 12. Exemplarily, each first rewiring structure 12 includes two alignment marks 122, and the two alignment marks 122 are both arranged at positions of the first rewiring structure 12 close to the first substrate 11.

In S123, second alignment marks 111 are formed on the first substrate 11, and each second alignment mark 111 is arranged corresponding to the first alignment mark 122.

Each second alignment mark 111 is arranged corresponding to the first alignment mark 122, and the first rewiring structures 12 may be accurately placed at preset positions in a subsequent step, which is beneficial to improving the alignment precision. Exemplarily, each first alignment mark 122 corresponds to two second alignment marks 111, and a distance between the two second alignment marks 111 which accommodates the first alignment mark 122 is reserved.

In S124, a temporary insulating layer 13 is formed on the second alignment marks 111.

A material of the temporary insulating layer 13 may be, for example, an organic material or an inorganic material. In an embodiment, the material of the temporary insulating layer 13 may include at least one of $SiO_2$, $Si_3N_4$, SiON, $Al_2O_3$, polyimide, or other materials. Exemplarily, the temporary insulating layer 13 may be fabricated by chemical vapor deposition, printing, spin coating, spray coating, lamination, or other suitable processes.

In S125, the multiple first rewiring structures 12 are arranged on the temporary insulating layer 13 at intervals.

The first alignment marks 122 of each first rewiring structure 12 are aligned with corresponding second alignment marks 111 formed on the first substrate 11. In an embodiment, the first alignment marks 122 and the corresponding second alignment marks 111 are nested in a direction perpendicular to the first substrate 11, that is, each first alignment mark 122 is located within projections of two corresponding second alignment marks 111 in the direction perpendicular to the first substrate 11.

In the embodiment of the present disclosure, the arrangement of the first alignment marks 122 and the second alignment marks 111 is beneficial to the accurate alignment of the first rewiring structures 12 and the first substrate 11. Moreover, in subsequent processes, in an embodiment, the first substrate 11 may be removed first, and the second alignment marks 111 may be retained along with the temporary insulating layer 13. In the subsequent processes, in an embodiment, the first substrate 11 and the temporary insulating layer 13 are removed together, and the second alignment marks 111 may be removed along with the temporary insulating layer 13.

Figure 14:
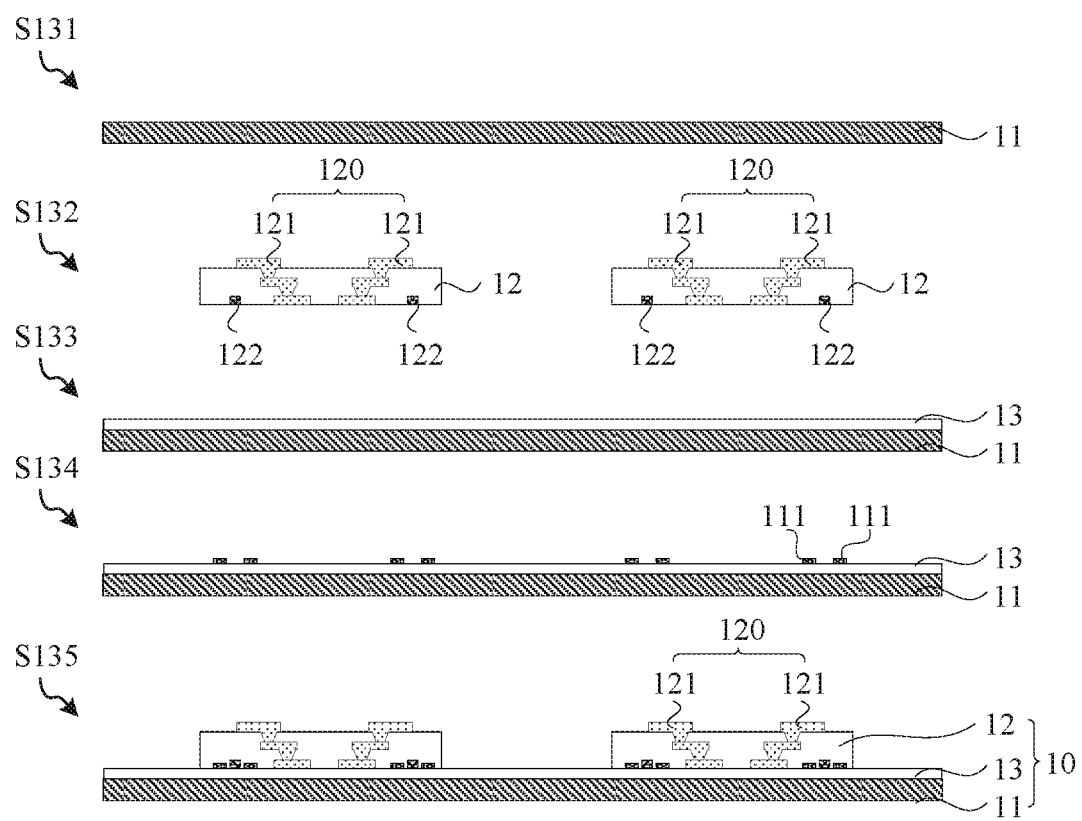
FIG. 14 is a schematic diagram illustrating structures formed by steps of another method for fabricating a first workpiece according to an embodiment of the present disclosure.

FIG. 14 is a schematic diagram illustrating structures formed by steps of another method for fabricating a first workpiece according to an embodiment of the present disclosure. Referring to FIG. 14, exemplarily, the method for fabricating the first workpiece includes steps described below.

In S131, a first substrate 11 is provided.

In S132, multiple first rewiring structures 12 are provided.

The first rewiring structure 12 further includes a first alignment mark 122, and the first alignment mark 122 is used for marking a position of the first rewiring structure 12. Exemplarily, each first rewiring structure 12 includes two alignment marks 122, and the two alignment marks 122 are both arranged at positions of the first rewiring structure 12 close to the first substrate 11.

In S133, a temporary insulating layer 13 is formed on the first substrate 11.

A material of the temporary insulating layer 13 may be, for example, an organic material or an inorganic material. In an embodiment, the material of the temporary insulating layer 13 may include at least one of $SiO_2$, $Si_3N_4$, SiON, $Al_2O_3$, polyimide, or other materials. Exemplarily, the temporary insulating layer 13 may be fabricated by chemical vapor deposition, printing, spin coating, spray coating, lamination, or other suitable processes.

In S134, second alignment marks 111 are formed on the temporary insulating layer 13, and each second alignment mark 111 is arranged corresponding to the first alignment mark 122.

Each second alignment mark 111 is arranged corresponding to the first alignment mark 122, and the first rewiring structures 12 may be accurately placed at preset positions in a subsequent step, which is beneficial to improving the alignment precision. Exemplarily, each first alignment mark 122 corresponds to two second alignment marks 111, and a distance between the two second alignment marks 111 which accommodates the first alignment mark 122 is reserved.

In S135, the multiple first rewiring structures 12 are arranged on the temporary insulating layer 13 at intervals.

The first alignment marks 122 of each first rewiring structure 12 are aligned with corresponding second alignment marks 111 formed on the first substrate 11. In an embodiment, the first alignment marks 122 and the corresponding second alignment marks 111 are nested in a direction perpendicular to the first substrate 11, that is, each first alignment mark 122 is located within projections of two corresponding second alignment marks 111 in the direction perpendicular to the first substrate 11.

It can be seen from the above steps that, different from the method for fabricating the first workpiece 10 in FIG. 13, in the embodiment of the present disclosure, the second alignment marks 111 are fabricated after the temporary insulating layer 13 is formed. The arrangement of the first alignment marks 122 and the second alignment marks 111 in the embodiment of the present disclosure is beneficial to the accurate alignment of the first rewiring structures 12 and the first substrate 11. Moreover, in subsequent processes, in an embodiment, the first substrate 11 and the temporary insulating layer 13 are removed together or only the first substrate 11 is removed, and the second alignment marks 111 may be retained along with the temporary insulating layer 13.

On the basis of the embodiments described above, in an embodiment, there are many methods for fabricating the second rewiring layers 30, and several of them are described below, but not as limitations of the present disclosure.

Figure 15:
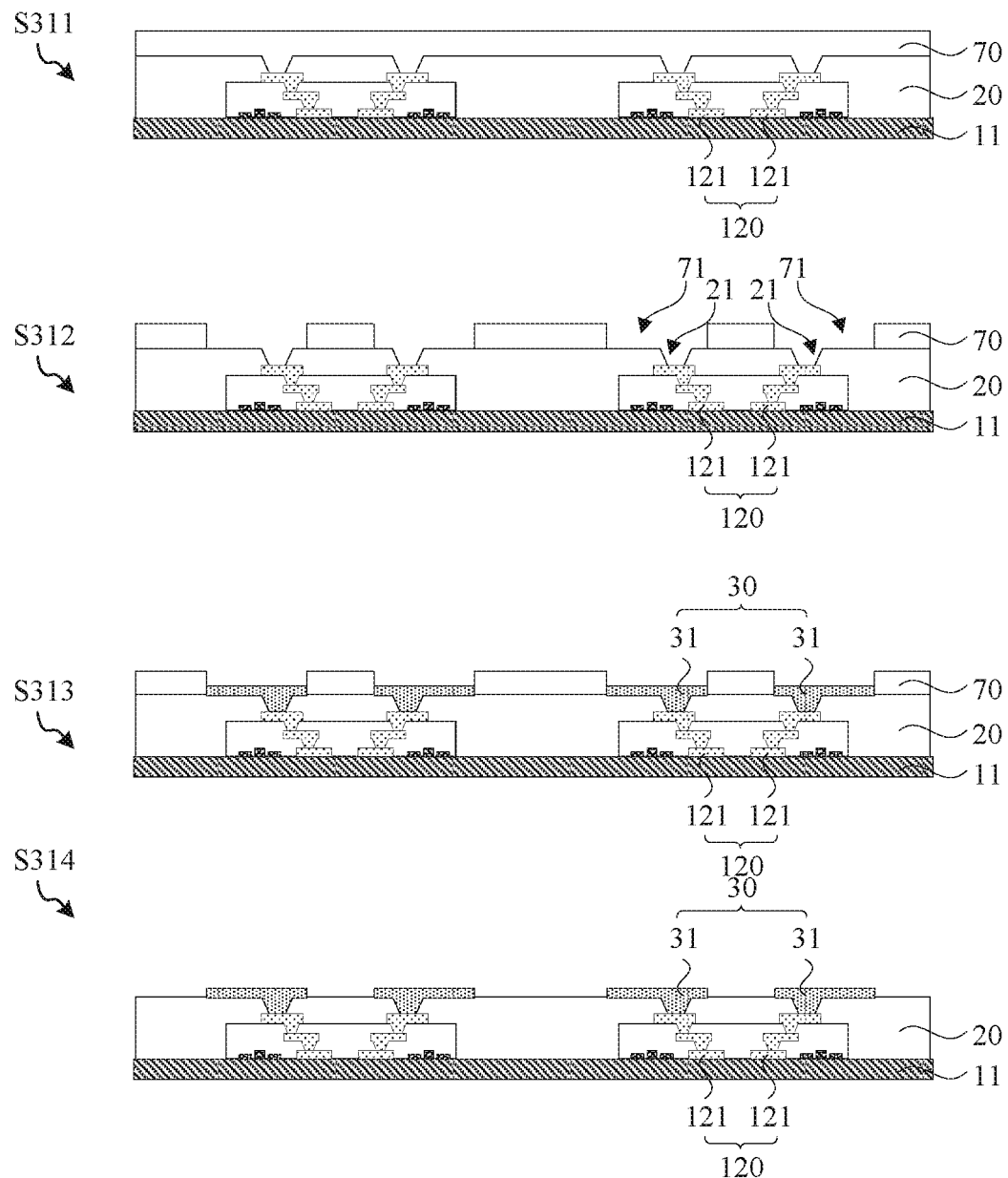
FIG. 15 is a schematic diagram illustrating structures formed by steps of a method for fabricating a second rewiring layer according to an embodiment of the present disclosure.

FIG. 15 is a schematic diagram illustrating structures formed by steps of a method for fabricating a second rewiring layer according to an embodiment of the present disclosure. Referring to FIG. 15, the method for fabricating the second rewiring layer 30 includes steps described below.

In S311, a first photoresist layer 70 is formed on an encapsulation layer 20.

The first photoresist layer 70 may be, for example, a photoresist, and a material of the photoresist may be a positive photoresist or a negative photoresist. Exemplarily, the first photoresist layer 70 may be formed on the encapsulation layer 20 by a coating process.

In S312, a patterned processing is performed on the first photoresist layer 70.

An opening 71 is formed at a position corresponding to each first through hole 21. Exemplarily, the first photoresist layer 70 may be patterned by an exposure process and a development process to form the openings 71. The openings 71 may accommodate a second wire part 31 of the second rewiring layer 30 in subsequent processes, therefore the shape of the opening 71 defines the shape of the second wire part 31 of the second rewiring layer 30.

In S313, the second wire part 31 of the second rewiring layer 30 is formed within the openings 71.

The second wire part 31 of the second rewiring layer 30 fills the openings 71 and the first through holes 21, and the second rewiring layer 30 is electrically connected to the first rewiring layer 120 through the multiple first through holes 21. A material of the second wire part 31 may be, for example, copper or gold. Exemplarily, the second wire part 31 may be filled within the openings 71 and the first through holes 21 by an electroplating process.

In S314, the remaining first photoresist layer 70 is removed.

It can be seen from S311-S314 that a photolithography and electroplating process are used for the fabricating process of the second rewiring layer 30 provided by the embodiment of the present disclosure. Multiple second rewiring layers 30 may be formed by repeating the above steps. The second rewiring layer 30 fabricated by the photolithography and electroplating process has high precision and is suitable for high-precision patterning.

Figure 16:
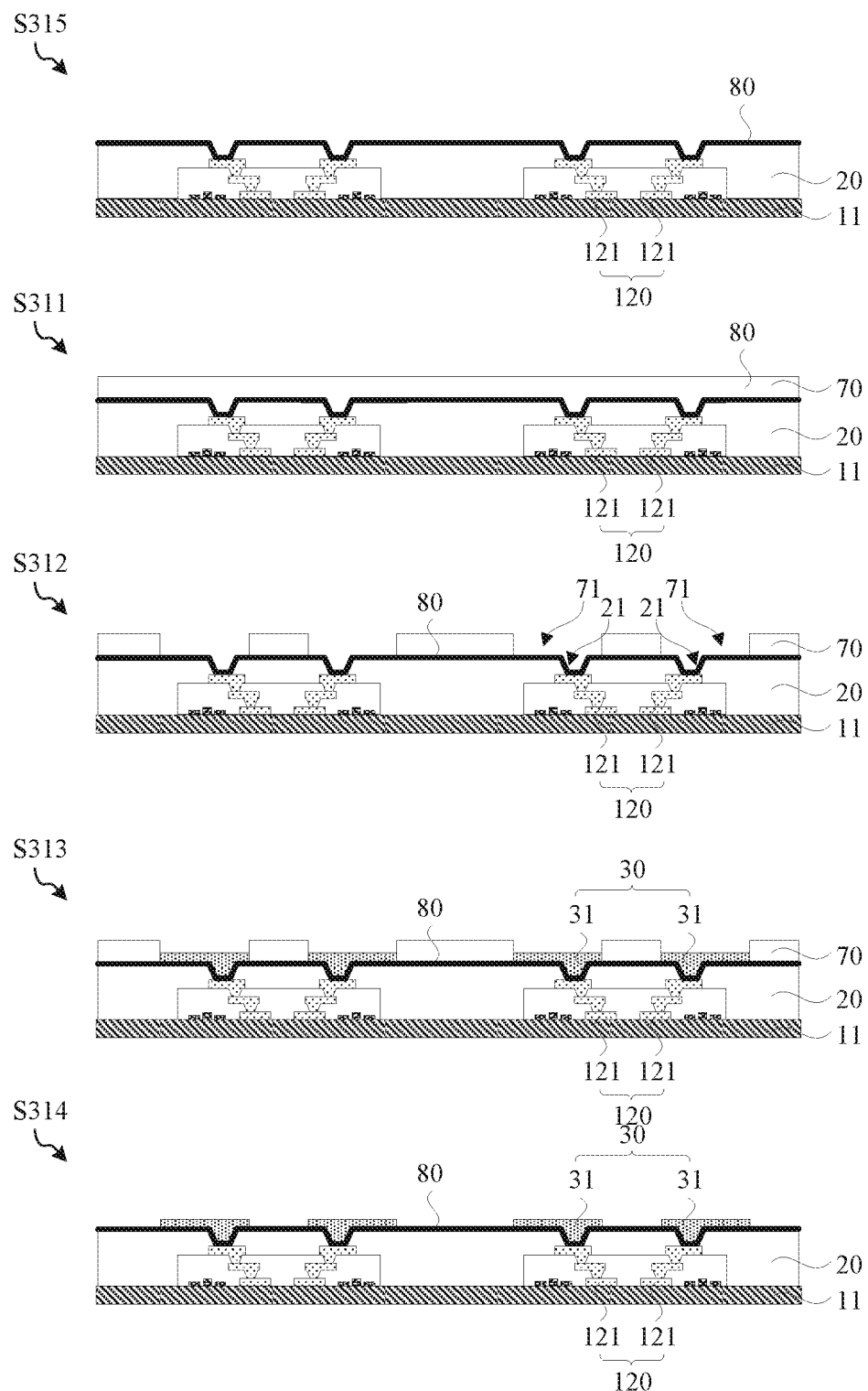
FIG. 16 is a schematic diagram illustrating structures formed by steps of another method for fabricating a second rewiring layer according to an embodiment of the present disclosure.

FIG. 16 is a schematic diagram illustrating structures formed by steps of another method for fabricating a second rewiring layer according to an embodiment of the present disclosure. Referring to FIG. 16, in an embodiment, the method for fabricating the second rewiring layer 30 includes steps described below.

In S315, a seed layer 80 is formed on an encapsulation layer 20.

The seed layer 80 covers the encapsulation layer 20 and inner side faces of first through holes 21, and the seed layer 80 is electrically connected to a first rewiring layer 120. Exemplarily, the seed layer 80 may be formed on the encapsulation layer 20 by a coating process.

In S311, a first photoresist layer 70 is formed on the seed layer 80.

In S312, a patterned processing is performed on the first photoresist layer 70.

In S313, a second wire part 31 of the second rewiring layer 30 is formed within openings 71.

The second wire part 31 of the second rewiring layer 30 fills the openings 71 and the first through holes 21. The second rewiring layer 30 is electrically connected to the seed layer 80 through the multiple first through holes 21. A material of the second wire part 31 may be, for example, copper or gold. Exemplarily, the second wire part 31 may be filled within the openings 71 and the first through holes 21 by an electroplating process.

In S314, the remaining first photoresist layer 70 is removed.

It can be seen from the above steps that the fabricating process of the second rewiring layer 30 provided by the embodiment of the present disclosure includes that one seed layer 80 is first formed before each second rewiring layer 30 is formed, so that crystals of the second rewiring layer 30 are uniform, which is beneficial to avoiding abnormal growth of crystal grains of the second rewiring layer 30 in the electroplating process, and is beneficial to an electrical connection between the second rewiring layer 30 and the first rewiring layer 120. Multiple second rewiring layers 30 may be formed by repeating the above steps.

Figure 17:
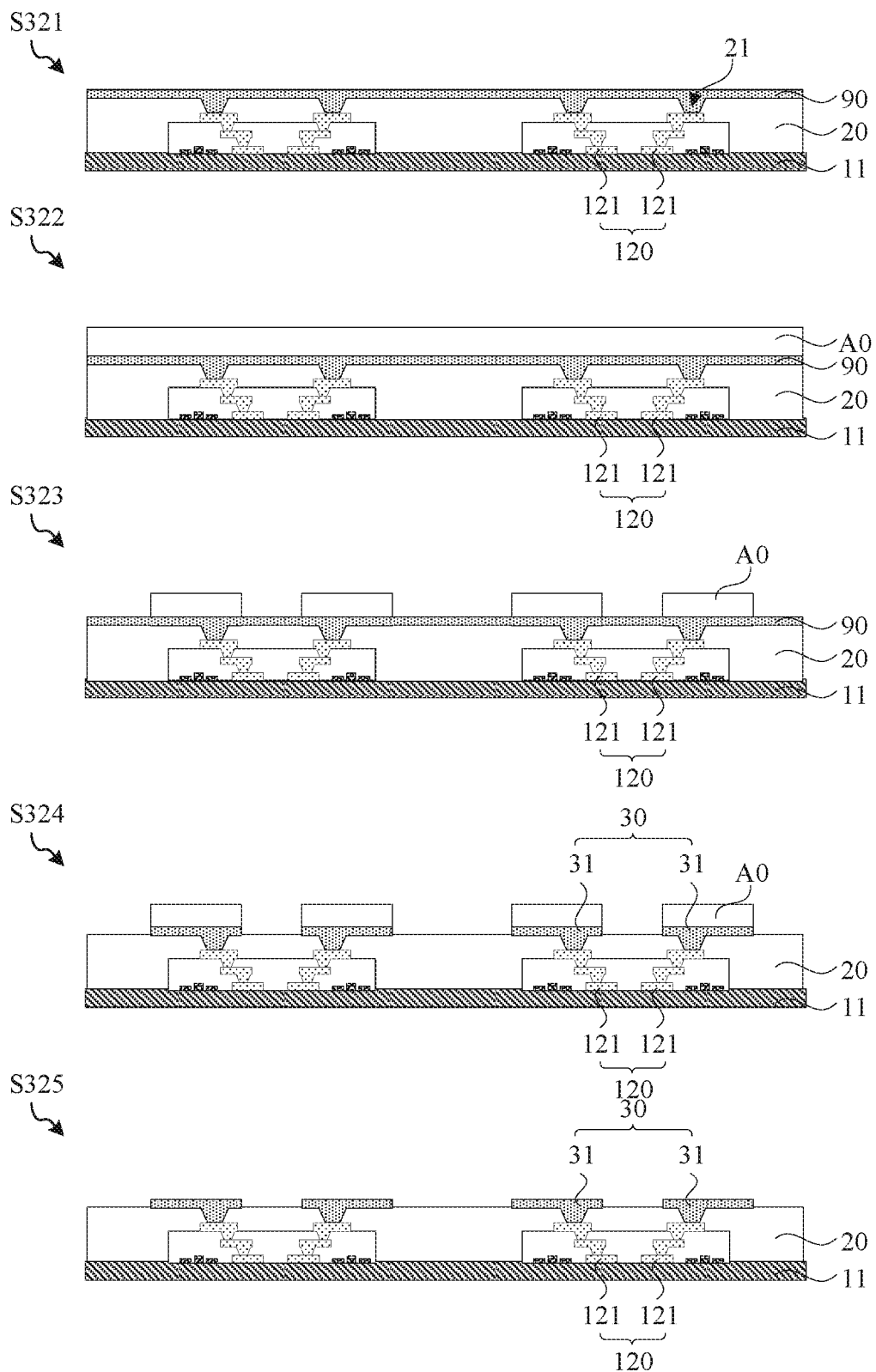
FIG. 17 is a schematic diagram illustrating structures formed by steps of another method for fabricating a second rewiring layer according to an embodiment of the present disclosure.

FIG. 17 is a schematic diagram illustrating structures formed by steps of another method for fabricating a second rewiring layer according to an embodiment of the present disclosure. Referring to FIG. 17, the method for fabricating the second rewiring layer 30 includes steps described below.

In S321, a second material layer 90 is formed on an encapsulation layer 20. The second material layer 90 covers the encapsulation layer 20 and fills first through holes 21.

The second material layer 90 may be, for example, copper or gold. Exemplarily, the second material layer 90 may be formed on the encapsulation layer 20 by an electroplating process. The second material layer 90 fills the first through holes 21, thereby facilitating good contact and electrical connection between the second rewiring layer 30 and the first rewiring layer 120.

In S322, a second photoresist layer A0 is formed on the second material layer 90.

The second photoresist layer A0 may be, for example, a photoresist, and a material of the photoresist may be a positive photoresist or a negative photoresist. Exemplarily, the second photoresist layer A0 may be formed on the second material layer 90 by a coating process.

In S323, a patterned processing is performed on the second photoresist layer A0.

Exemplarily, the second photoresist layer A0 may be patterned by an exposure process and a development process to expose portions of the second material layer 90 that need to be etched away.

In S324, an etching processing is performed on the second material layer 90.

Exemplarily, the second material layer 90 may be etched by a wet etching process, a dry etching process or the like.

In S325, the remaining second photoresist layer A0 is removed.

It can be seen from S321-S325 that an electroplating and photolithography process are used for the fabricating process of the second rewiring layer 30. Multiple second rewiring layers 30 may be formed by repeating the above steps.

Figure 18:
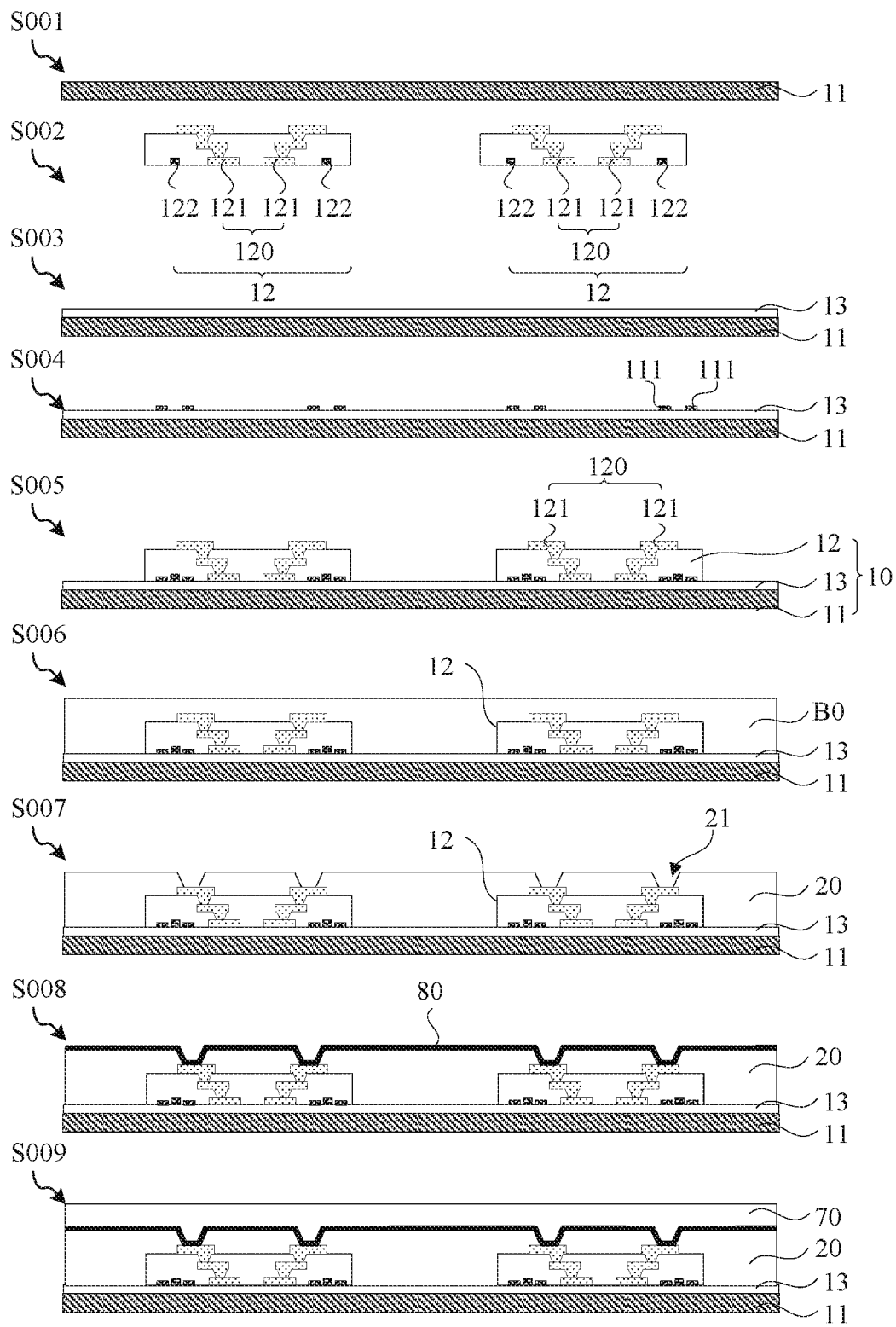
FIG. 18 is a schematic diagram illustrating structures formed by S001 to S009 in a method for fabricating a semiconductor package according to an embodiment of the present disclosure.
Figure 19:
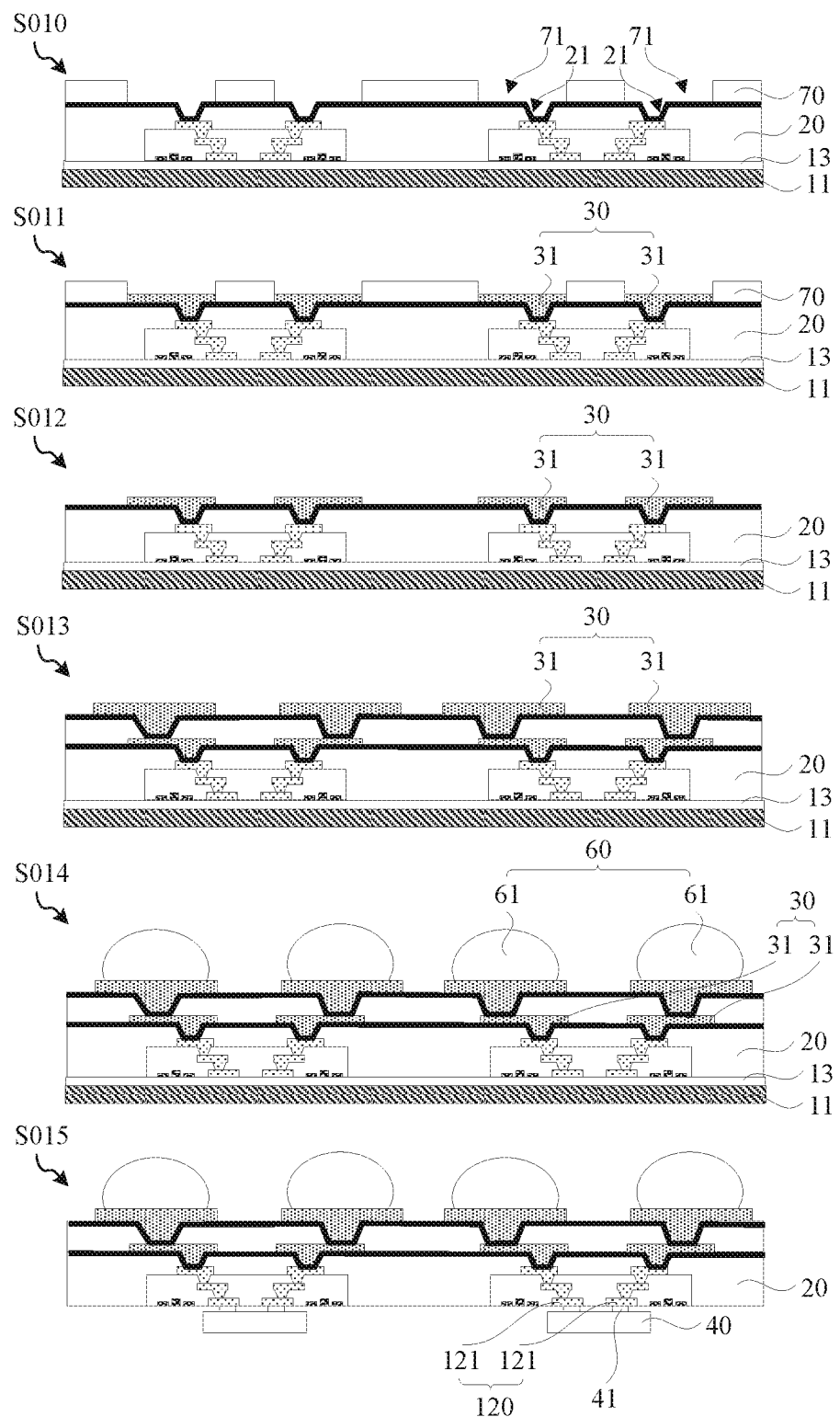
FIG. 19 is a schematic diagram illustrating structures formed by S010 to S015 in a method for fabricating a semiconductor package according to an embodiment of the present disclosure.
Figure 20:
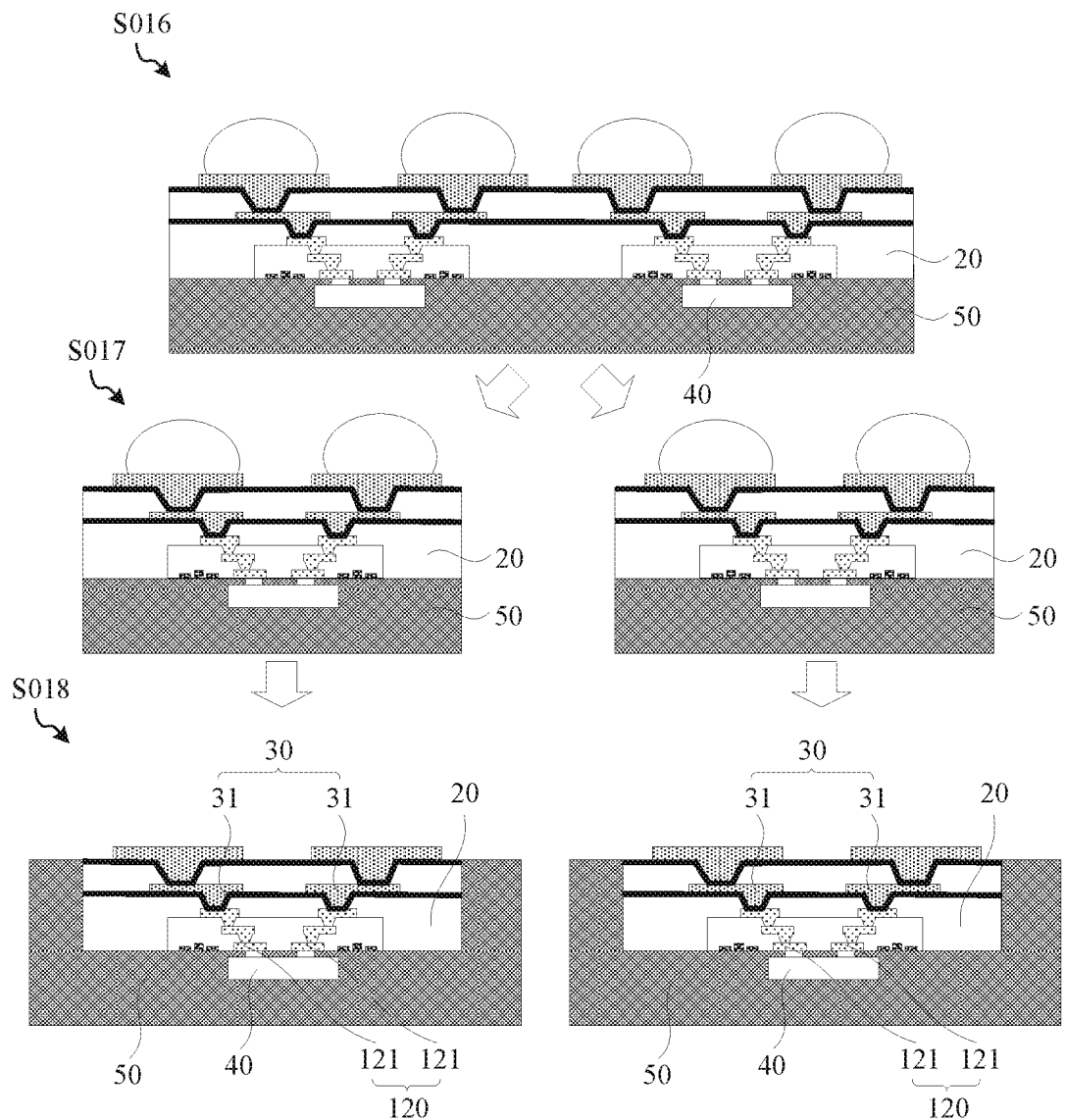
FIG. 20 is a schematic diagram illustrating structures formed by S016 to S018 in a method for fabricating a semiconductor package according to an embodiment of the present disclosure.

FIG. 18 is a schematic diagram illustrating structures formed by S001 to S009 in a method for fabricating a semiconductor package according to an embodiment of the present disclosure. FIG. 19 is a schematic diagram illustrating structures formed by S010 to S015 in a method for fabricating a semiconductor package according to an embodiment of the present disclosure. FIG. 20 is a schematic diagram illustrating structures formed by S016 to S018 in a method for fabricating a semiconductor package according to an embodiment of the present disclosure. Referring to FIGS. 18 to 20, on the basis of the embodiments described above, in an embodiment, the method for fabricating the semiconductor package includes steps described below.

In S001, a first substrate 11 is provided.

In S002, multiple first rewiring structures 12 are provided.

In S003, a temporary insulating layer 13 is formed on the first substrate 11.

In S004, second alignment marks 111 are formed on the temporary insulating layer 13, and each second alignment mark 111 is arranged corresponding to a first alignment mark 122.

In S005, the multiple first rewiring structures 12 are arranged on the temporary insulating layer 13 at intervals.

In S006, an encapsulation material layer B0 is formed on first rewiring layers 120. The encapsulation material layer B0 coats the first rewiring layers 120.

In S007, a patterned processing is performed at positions corresponding to a first wire part 121 of the first rewiring layer 120 to form multiple first through holes 21.

In S008, a seed layer 80 is formed on the encapsulation layer 20. The seed layer 80 covers the encapsulation layer 20 and inner side faces of the first through holes 21, and the seed layer 80 is electrically connected to the first rewiring layer 120.

In S009, a first photoresist layer 70 is formed on the encapsulation layer 20.

In S010, a patterned processing is performed on the first photoresist layer 70 to form an opening 71 at a position corresponding to each first through hole 21.

In S011, a second wire part 31 of the second rewiring layer 30 is formed within the openings 71. The second wire part 31 of the second rewiring layer 30 fills the openings 71 and the first through holes 21, and the second rewiring layer 30 is electrically connected to the first rewiring layer 120 through the multiple first through holes 21.

In S012, the remaining first photoresist layer 70 is removed.

In S013, the second one of the second rewiring layers 30 is formed by repeating S007 to S010.

In S014, a solder ball group 60 is formed on a side of the second rewiring layers 30 facing away from semiconductor elements 40.

In S015, multiple semiconductor elements 40 are provided, and the semiconductor elements 40 are arranged on a side of the first rewiring layers 120 facing away from the encapsulation layer 20. The first rewiring layers 120 are electrically connected to pins 41 of the semiconductor elements 40.

In S016, a plastic encapsulation layer 50 is formed on a side of the semiconductor elements 40 facing away from the second rewiring layers 30. The plastic encapsulation layer 50 coats the semiconductor elements 40.

In S017, the encapsulation layer 20, the first rewiring layers 120 and the plastic encapsulation layer 50 are cut.

In S018, the plastic encapsulation layer 50 is formed on side surfaces of the encapsulation layer 20 and side surfaces of the second rewiring layers 30.

As can be seen from S001 to S018, the embodiment of the present disclosure provides a specific method for fabricating a semiconductor package. By adopting this fabricating method, not only low cost and high yield can be achieved on the basis of high precision, but also an alignment precision can be improved, a reliable electrical connection between the second rewiring layers 30 and the first rewiring layers 120 is ensured, and the protection performance and the heat dissipation performance of the semiconductor package are enhanced.

It should be noted that the above embodiments exemplarily show that the structures within the first through holes 21 of the encapsulation layer 20 are fabricated and formed in the same step as the second rewiring layer 30, which is not a limitation of the present disclosure. In other embodiments, it may also be provided that the structures within the first through holes 21 of the encapsulation layer 20 are fabricated and formed in the same step as the first rewiring layer 120.

Figure 21:
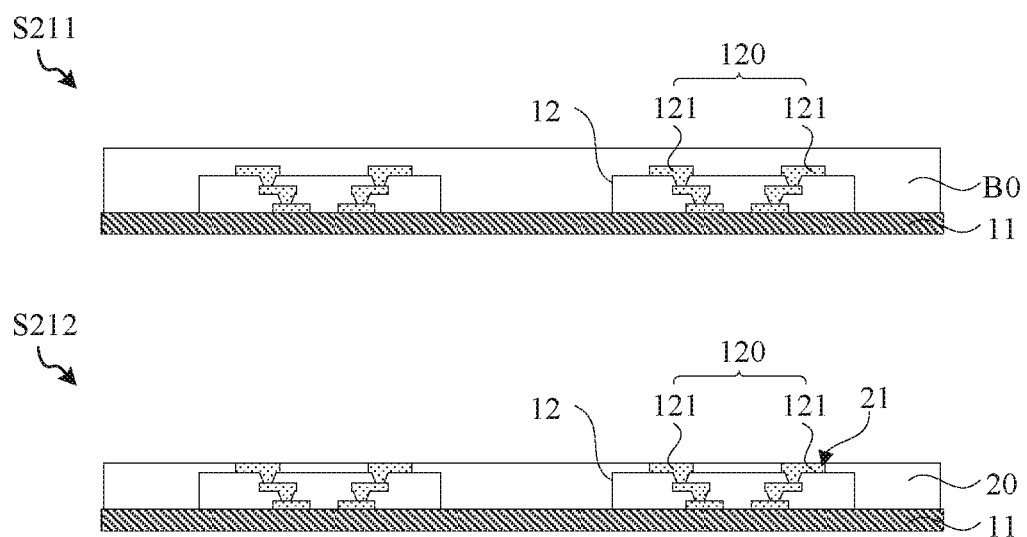
FIG. 21 is a schematic diagram illustrating structures formed by steps of a method for fabricating an encapsulation layer according to an embodiment of the present disclosure.

FIG. 21 is a schematic diagram illustrating structures formed by steps of a method for fabricating an encapsulation layer according to an embodiment of the present disclosure.

Referring to FIG. 21, in an embodiment, the method for fabricating the encapsulation layer 20 includes steps described below.

In S211, an encapsulation material layer B0 is formed on first rewiring layers 120. The encapsulation material layer B0 coats the first rewiring layers 120.

The encapsulation layer 20 covers first rewiring structures 12 to flatten the first rewiring structures 12. In an embodiment, a material of the encapsulation layer 20 includes at least one of following insulating materials: polyimide, liquid crystal polymer or acrylic, to play a good insulating role.

In S212, the encapsulation material layer B0 is thinned to expose a first wire part 121 of the first rewiring layer 120. The first wire part 121 is located within first through holes 21 of the encapsulation layer 20.

Exemplarily, the encapsulation layer 20 may be thinned by a grinding process or a laser cutting process.

Different from the foregoing embodiments, the embodiment of the present disclosure does not need to limit the continuous fabrication of the second rewiring layer 120 on the first workpiece 10, which is beneficial to the independent fabrications of the second rewiring layer 120 and the first workpiece 10.

Figure 22:
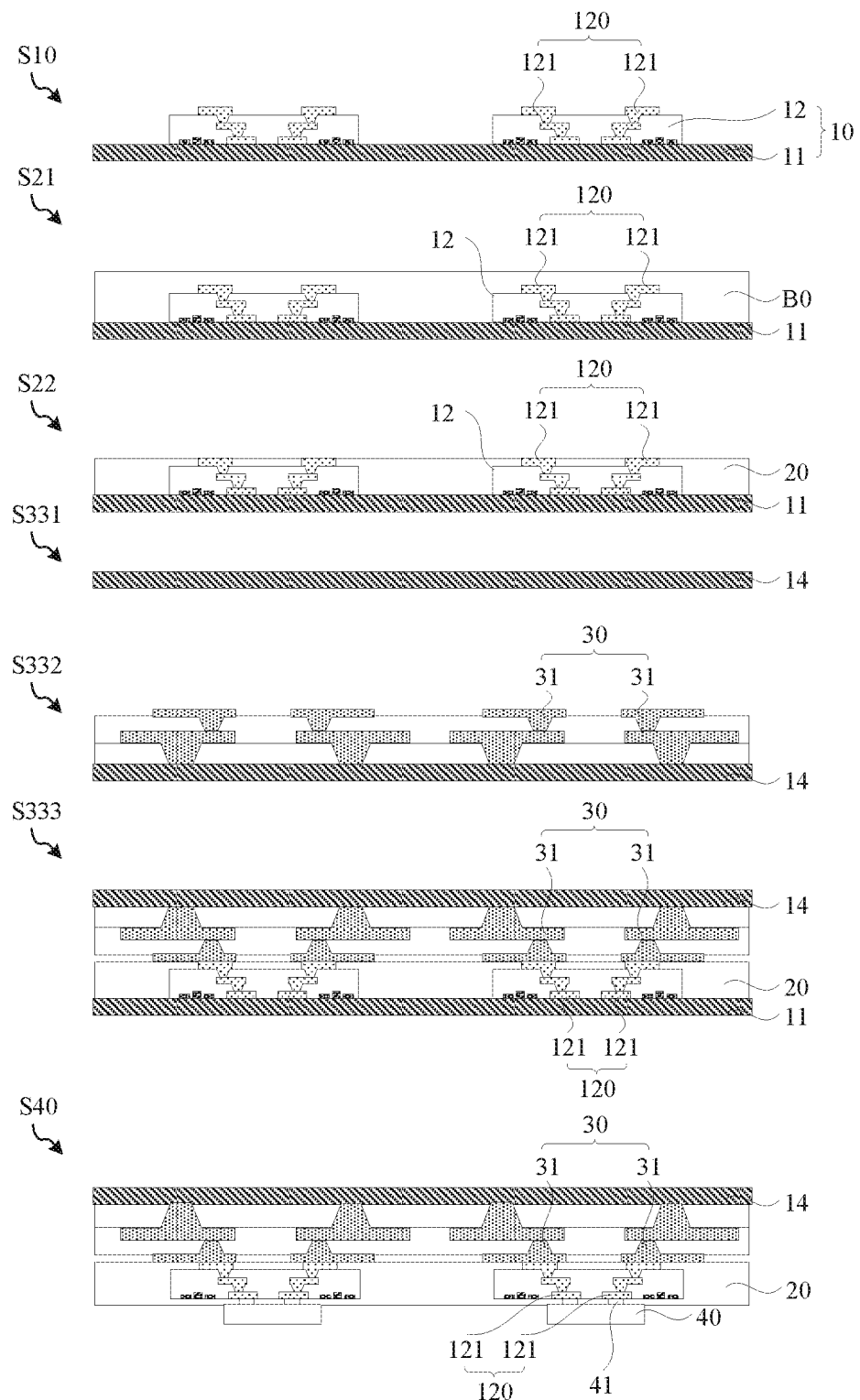
FIG. 22 is a schematic diagram illustrating structures formed by steps of another method for fabricating a semiconductor package according to an embodiment of the present disclosure.

FIG. 22 is a schematic diagram illustrating structures formed by steps of another method for fabricating a semiconductor package according to an embodiment of the present disclosure. Referring to FIG. 22, in an embodiment, the method for fabricating the semiconductor package includes steps described below.

In S10, a first workpiece 10 is provided. The first workpiece 10 includes a first substrate 11 and multiple first rewiring structures 12 arranged on the first substrate 11 at intervals, and the first rewiring structure 12 includes at least two first rewiring layers 120.

The method for fabricating the first workpiece 10 is similar to that of the foregoing embodiments, which is not repeated here. In an embodiment, in a direction away from the first substrate 11, precisions of the at least two first rewiring layers 120 gradually decrease, that is, wire widths of the at least two first rewiring layers 120 gradually increase, to facilitate a subsequent electrical connection between the first rewiring layers 120 and second rewiring layers 30.

In S211, an encapsulation material layer B0 is formed on the first rewiring layers 120, and the encapsulation material layer B0 coats the first rewiring layers 120.

In S212, the encapsulation layer 20 is thinned to expose a first wire part 121 of the first rewiring layer 120. The first wire part 121 is located within first through holes 21 of the encapsulation layer 20.

In S331, a second substrate 14 is provided.

Similar to the first substrate 11, the second substrate 14 may be, for example, a glass or a copper foil. In an embodiment, the second substrate 14 may be suitable for use in the panel-level process. Compared with a substrate in the wafer-level process, the substrate in the panel-level process has a larger size, for example, the size is 300 mm*300 mm or larger. Therefore, the use of the panel-level process is beneficial to implementing the fabrication of more semiconductor packages on the basis of a larger substrate. In an embodiment, the size of the first substrate 11 and the size of the second substrate 14 are equal to facilitate an accurate alignment in subsequent processes.

In S332, at least two second rewiring layers 30 are fabricated on the second substrate 14 in sequence.

The method for fabricating the second rewiring layers 30 is similar to that of the foregoing embodiments, which is not repeated here. In an embodiment, in a direction away from the second substrate 14, precisions of the at least two second rewiring layers 30 gradually increase, that is, wire widths of the at least two second rewiring layers 30 gradually decrease, to facilitate a subsequent electrical connection between the first rewiring layers 120 and the second rewiring layers 30.

In S333, the second substrate 14 is turned over, and a side of the at least two second rewiring layers 30 facing away from the second substrate 14 is formed on a side of the encapsulation layer 20 facing away from the first rewiring layers 120. Alternatively, the first substrate 11 is turned over, a side of the first rewiring layers 120 facing away from the encapsulation layer 20 is disposed on the side of the second rewiring layers 30 facing away from the second substrate 14.

Exemplarily, the first rewiring layer 120 may be contacted with the second rewiring layer 30 by a bonding process or a crimping process, so that a conductive connection layer such as a solder is formed on a formed contact surface.

In S40, multiple semiconductor elements 40 are provided, and the multiple semiconductor elements 40 are arranged on the side of the first rewiring layers 120 facing away from the encapsulation layer 20.

It can be seen from the above steps that, different from the embodiments described above, in this embodiment of the present disclosure, for the electrical connection between the fabricated second rewiring layers 30 and the fabricated first rewiring layers 120, the steps of these two methods and the structures of the semiconductor packages fabricated by these two methods are different, but low cost and high yield can be achieved on the basis of high precision.

On the basis of the embodiments described above, in an embodiment, before the step in which the at least two second rewiring layers 30 are fabricated on the second substrate 14, the method further includes following steps: a seed layer is formed on the second substrate 14, where the seed layer covers the second substrate 14; the at least two second rewiring layers 30 are formed on the seed layer, where the second rewiring layers 30 are electrically connected to the seed layer. The method for fabricating the seed layer is similar to those of the foregoing embodiments, which is not repeated here.

Figure 23:
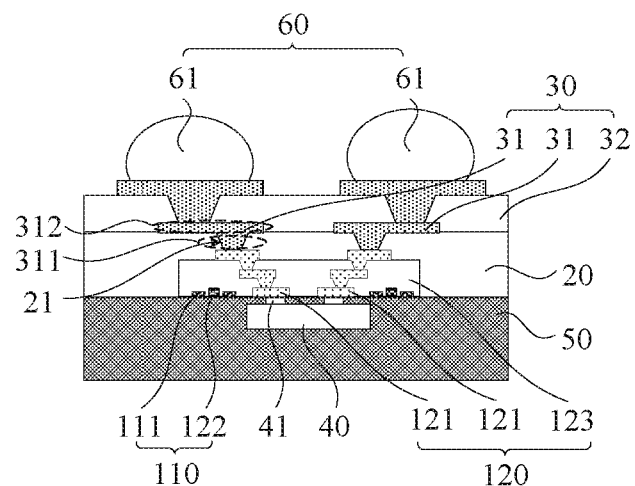
FIG. 23 is a structural diagram of a semiconductor package according to an embodiment of the present disclosure.

An embodiment of the present disclosure further provides a semiconductor package. The semiconductor package may be fabricated by the method for fabricating the semiconductor package provided in any one of the embodiments of the present disclosure. FIG. 23 is a structural diagram of a semiconductor package according to an embodiment of the present disclosure. Referring to FIG. 23, the semiconductor package includes at least two first rewiring layers 120, an encapsulation layer 20, second rewiring layers 30 and a semiconductor element 40. The encapsulation layer 20 is located on a side of the at least two first rewiring layers 120, and the encapsulation layer 20 coats the first rewiring layers 120. The second rewiring layers 30 are located on a side of the encapsulation layer 20 facing away from the first rewiring layers 120, and the second rewiring layers 30 are electrically connected to the first rewiring layers 120 through first through holes penetrating through the encapsulation layer 20. The semiconductor element 40 includes multiple pins. The semiconductor element 40 is located on a side of the first rewiring layers 120 facing away from the encapsulation layer 20, and the multiple pins 41 of the semiconductor element 40 are electrically connected to the first rewiring layers 120.

FIG. 23 exemplarily shows that the semiconductor package includes two pins 41, which is not a limitation of the present disclosure. The semiconductor package provided in the embodiment of the present disclosure may include 4, 5, 10, 16, 32, or more pins. The encapsulation layer 20 coats the first rewiring structure 12, and a material of the encapsulation layer 20 includes at least one of polyimide (PI), liquid crystal polymer or acrylic, so as to play a good insulating role. The second rewiring layers 30 are electrically connected to the first rewiring layers 120 through first through holes penetrating through the encapsulation layer 20, so as to facilitate the reliable contact and electrical connection between the second rewiring layers 30 and the first rewiring layers 120. Each first rewiring layer 120 includes a first wire part 121. The first wire part 121 is used for an electrical connection with the pins of the semiconductor element and for an electrical connection between the first rewiring layers 120. FIG. 23 exemplarily shows that the number of the first rewiring layers 120 is three, and the number of the first rewiring layers 120 may also be two, four, five, or more, which may be determined according to the size of the semiconductor package, the size of the semiconductor element, and the process precision in practical applications. Exemplarily, the first rewiring layers 120 are high-precision rewiring layers, and the minimum wire width of the first rewiring layers 120 may be, for example, less than 5 um, 4 um, 3 um, 2 um, 1 um, 0.5 um, or less.

The second rewiring layer 30 is similar to the first rewiring layer 120 in structure and function. The second rewiring layer 30 is used for an electrical connection with the first rewiring layer 120 and for an electrical connection between the second rewiring layers 30. In an embodiment, the second rewiring layer 30 includes a second wire part 31, and the first wire part 121 of the first rewiring layer 120 with the shortest distance to one of the at least two second rewiring layers 30 is electrically connected to the second wire part 31 of the one of the at least two second rewiring layers 30. FIG. 23 exemplarily shows that the number of the second rewiring layers 30 is two, and the number of the second rewiring layers 30 may also be three, four, five, or more, which may be determined according to the size of the semiconductor package, the size of the semiconductor element 40, and the process precision in practical applications. The second rewiring layers 30 are different from the first rewiring layers 120 in that the minimum wire width of the second rewiring layers 30 is different from the minimum wire width of the first rewiring layers 120. Corresponding to the first rewiring layers 120, the second rewiring layers 30 are low-precision rewiring layers, and the minimum wire width of the second rewiring layers 30 may be greater than or equal to, for example, 5 um, 4 um, 3 um, 2 um, 1 um, 0.5 um, or other sizes. Moreover, the first rewiring layer 120 with the shortest distance to the semiconductor element 40 has the minimum wire width and the highest precision, and the first rewiring layer 120 and the second rewiring layer 30 farther from the semiconductor element 40 have the larger wire width and the lower precision.

The structure arrangement of the semiconductor package provided by the embodiment of the present disclosure is beneficial to be fabricated by adopting the method for fabricating the semiconductor package provided by any one of the embodiments of the present disclosure. Therefore, according to the embodiment of the present disclosure, low cost and high yield may be achieved on the basis of implementing high precision.

With continued reference to FIG. 23, on the basis of the embodiment described above, in an embodiment, the semiconductor package further includes a plastic encapsulation layer 50. The plastic encapsulation layer 50 coats the semiconductor element 40 and is in contact with the semiconductor element 40. A projection of the encapsulation layer 20 is located within a projection of the plastic encapsulation layer 50 in a direction perpendicular to a plane in which the semiconductor element 40 is located. That is, the size of the encapsulation layer 20 is less than or equal to the size of the plastic encapsulation layer 50, and the semiconductor element 40 is completely buried in the plastic encapsulation layer 50. In an embodiment, a material of the plastic encapsulation layer 50 is different from a material of the encapsulation layer 20, and the material of the plastic encapsulation layer 50 may be, for example, an EMC. As can be seen from the method for fabricating the semiconductor package shown in FIGS. 6, 8 and 9, the semiconductor element 40 may be packaged by adopting an effective plastic encapsulation once in the embodiment of the present disclosure. The plastic encapsulation layer 50 may protect the semiconductor element 40 and provide a heat dissipation path for the semiconductor element 40.

It should be noted that FIG. 23 exemplarily shows a structure of the plastic encapsulation layer 50, which is not a limitation of the present disclosure. In other embodiments, the plastic encapsulation layer 50 may also be set in other structural forms.

Figure 24:
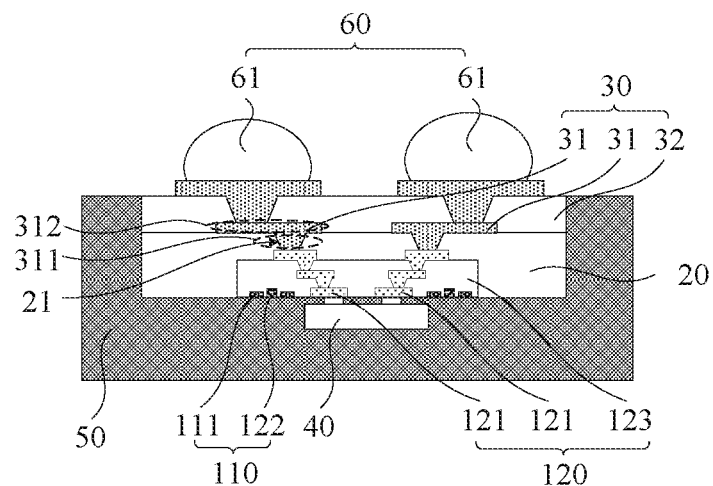
FIG. 24 is a structural diagram of another semiconductor package according to an embodiment of the present disclosure.

FIG. 24 is a structural diagram of another semiconductor package according to an embodiment of the present disclosure. Referring to FIG. 24, on the basis of the embodiments described above, in an embodiment, the plastic encapsulation layer 50 coats the semiconductor element 40, side surfaces of the encapsulation layer 20, and side surfaces of the second rewiring layers 30. The plastic encapsulation layer 50 is in contact with the semiconductor element 40, the side surfaces of the encapsulation layer 20, and the side surfaces of the second rewiring layers 30. A projection of the encapsulation layer 20 is located within a projection of the plastic encapsulation layer 50 in a direction perpendicular to a plane in which the semiconductor element 40 is located. That is, the size of the encapsulation layer 20 is less than or equal to the size of the plastic encapsulation layer 50, and the semiconductor element 40 is completely buried in the plastic encapsulation layer 50. In the embodiment of the present disclosure, the protection and heat dissipation of the semiconductor element 40 may be implemented, and the encapsulation layer 20 and the second rewiring layers 30 may be protected, thus the protection performance and the heat dissipation performance of the semiconductor package are enhanced.

With continued reference to FIGS. 23 and 24, on the basis of the embodiments described above, in an embodiment, the semiconductor package further includes a solder ball group 60, and the solder ball group 60 is located on a side of the second rewiring layers 30 facing away from the semiconductor element 40. The solder ball group 60 includes multiple first solder balls 61, and the multiple first solder balls 61 are electrically connected to the second rewiring layers 30, which is beneficial to the multiple first solder balls 61 to be used for implementing an electrical connection between pins 41 of the semiconductor element 40 and an external circuit.

With continued reference to FIGS. 23 and 24, on the basis of the embodiments described above, in an embodiment, the semiconductor package further includes alignment marks 110. The alignment marks 110 are located on a side of the first rewiring layers 120 close to the semiconductor element 40. The alignment marks 110 may include a first alignment mark 122 and a second alignment mark 111. The first alignment mark 122 and the second alignment mark 111 are described in detail in the method for fabricating the semiconductor package described below, which is not repeated here. In the embodiment of the present disclosure, the alignment marks 110 are provided, which is beneficial to improving the alignment precision.

It should be noted that FIGS. 23 and 24 exemplarily show that the alignment marks 110 may include the first alignment mark 122 and the second alignment mark 111, which is not a limitation of the present disclosure. In other embodiments, as can be seen from the method for fabricating the first workpiece 10 shown in FIG. 13, the alignment marks 110 may further include only the first alignment mark 122.

With continued reference to FIGS. 23 and 24, on the basis of the embodiments described above, in an embodiment, the first rewiring layers 120 includes first wire parts 121 and a first insulating layer 123, and the first wire parts 121 are buried in the first insulation layer 123. The second rewiring layers 30 includes second wire parts 31 and a second insulating layer 32, and the second wire parts 31 are buried in the second insulating layer 32. The first wire part 121 of the first rewiring layer 120 with the shortest distance to the semiconductor element 40 is electrically connected to the pins of the semiconductor element 40. The first wire part 121 of the first rewiring layer 120 with the shortest distance to one of the at least two second rewiring layers 30 is electrically connected to the second wire part 31 of the one of the at least two second rewiring layers 30.

With continued reference to FIGS. 23 and 24, on the basis of the embodiments described above, in an embodiment, the second wire part 31 of the second rewiring layer 30 with the shortest distance to the first rewiring layers 120 includes a first portion 311 and a second portion 312. The first portion 311 of the second wire part 31 is located within the first through holes 21 of the encapsulation layer 20, and the second portion 312 of the second wire part 31 is located between the second insulating layer 32 of the second rewiring layers 30 and the encapsulation layer 20. Therefore, in the embodiment of the present disclosure, the second rewiring layers 30 is directly contacted and electrically connected with the first rewiring layer 120, which is beneficial to reducing fabrication steps for implementing the electric connection between the second rewiring layers 30 and the first rewiring layers 120.

Figure 25:
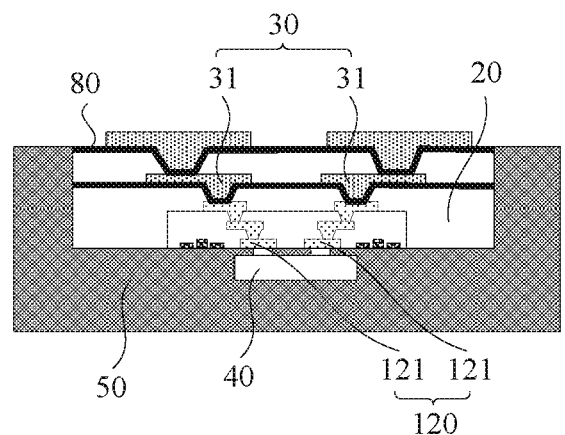
FIG. 25 is a structural diagram of another semiconductor package according to an embodiment of the present disclosure.

FIG. 25 is a structural diagram of another semiconductor package according to an embodiment of the present disclosure. Referring to FIG. 25, on the basis of the embodiments described above, in an embodiment, the second rewiring layers 30 further includes seed layers 80, and each seed layer 80 is located on a side of a corresponding second rewiring layer 30 close to the semiconductor element 40. The seed layer 80 makes the crystallization of the second rewiring layer 30 uniform, which is beneficial to avoiding abnormal growth of crystal grains of the second rewiring layer 30 in the electroplating process, and is beneficial to the electrical connection between the second rewiring layer 30 and the first rewiring layer 120.

Figure 26:
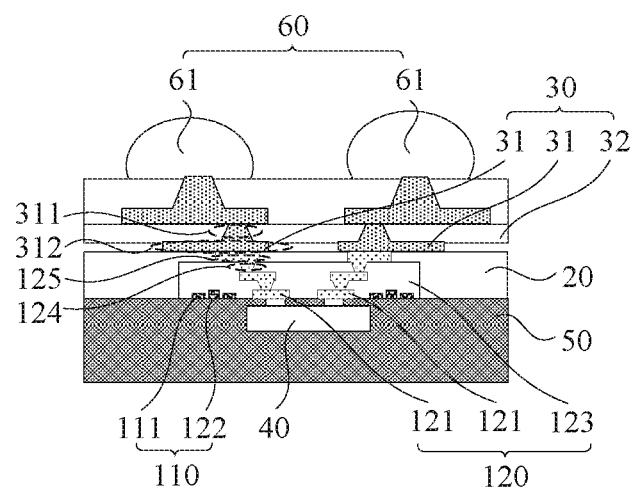
FIG. 26 is a structural diagram of another semiconductor package according to an embodiment of the present disclosure.

FIG. 26 is a structural diagram of another semiconductor package according to an embodiment of the present disclosure. Referring to FIG. 26, on the basis of the embodiments described above, in an embodiment, the second wire part 31 of the second rewiring layer 30 with the shortest distance to the first rewiring layers 120 includes a first portion 311 and a second portion 312. The first portion 311 of the second wire part 31 is located within the second insulating layer 32 of the second rewiring layers 30, and the second portion 312 of the second wire part 31 is located between the encapsulation layer 20 and the second rewiring layer 30.

With continued reference to FIG. 26, the first rewiring layer 120 with the shortest distance to the second rewiring layers 30 includes a first portion and a second portion. The first portion 124 of the first wire part 121 is located within the first insulating layer 123 of the first rewiring layers 120, and the second portion 125 of the first wire part 121 is located within the encapsulation layer 20. Therefore, in the embodiment of the present disclosure, the second rewiring layer 30 is directly contacted and electrically connected with the first rewiring layer 120, which is beneficial to reducing the fabrication steps for implementing the electric connection between the second rewiring layer 30 and the first rewiring layer 120.

On the basis of the embodiments described above, in an embodiment, the second rewiring layers 30 further includes seed layers, and each seed layer is located on a side of a corresponding second rewiring layer 30 facing away from the semiconductor element 40. The seed layer makes the crystallization of the second rewiring layer 30 uniform, which is beneficial to avoiding abnormal growth of crystal grains of the second rewiring layer 30 in the electroplating process, and is beneficial to the electrical connection between the second rewiring layer 30 and the first rewiring layer 120.

What is claimed is:

1. A method for fabricating a semiconductor package, comprising:
    providing a first workpiece, wherein the first workpiece comprises a first substrate and a plurality of first rewiring structures arranged on the first substrate at intervals, and each of the plurality of first rewiring structures comprises at least two first rewiring layers;
    forming an encapsulation layer on the plurality of first rewiring structures, wherein the encapsulation layer is provided with a plurality of first through holes, and the plurality of first through holes exposes one first rewiring layer;
    disposing at least two second rewiring layers on a side of the encapsulation layer facing away from the plurality of first rewiring structures, wherein the at least two second rewiring layers are electrically connected to the exposed first rewiring layer;
    removing the first substrate;
    providing a plurality of semiconductor elements, and arranging the plurality of semiconductor elements on a side of the plurality of first rewiring structures facing away from the encapsulation layer, wherein the at least two first rewiring layers are electrically connected to pins of the plurality of semiconductor elements; and
    performing cutting based on each of the plurality of semiconductor elements to obtain a plurality of semiconductor packages;
wherein providing the first workpiece comprises:
    providing the first substrate;
    providing the plurality of first rewiring structures; and
    arranging the plurality of first rewiring structures on the first substrate at intervals;
wherein each of the plurality of first rewiring structures further comprises a first alignment mark;
wherein after providing the first substrate and before arranging the plurality of first rewiring structures on the first substrate at intervals, the method further comprises one of the following:
    forming second alignment marks on the first substrate, wherein each of the second alignment marks is arranged corresponding to the first alignment mark: forming a temporary insulating layer on the second alignment marks; or
    forming a temporary insulating layer on the first substrate; and forming second alignment marks on the temporary insulating layer, wherein the second alignment marks are arranged corresponding to first alignment marks; and
wherein arranging the plurality of first rewiring structures on the first substrate at intervals comprises: arranging the plurality of first rewiring structures on the temporary insulating layer at intervals.

2. The method for fabricating the semiconductor package of claim 1, wherein after arranging the plurality of semiconductor elements on the side of the plurality of first rewiring structures facing away from the encapsulation layer, the method further comprises:
    forming a plastic encapsulation layer on a side of the plurality of semiconductor elements facing away from the at least two second rewiring layers, wherein the plastic encapsulation layer coats the plurality of semiconductor elements; and
    wherein performing cutting based on each of the plurality of semiconductor elements to obtain the plurality of semiconductor packages comprises:
    cutting the at least two second rewiring layers, the encapsulation layer and the plastic encapsulation layer based on each of the plurality of semiconductor elements, to obtain the plurality of semiconductor packages.

3. The method for fabricating the semiconductor package of claim 2, wherein after cutting the at least two second rewiring layers, the encapsulation layer and the plastic encapsulation layer, the method further comprises:
    forming a plastic encapsulation layer on side surfaces of the encapsulation layer and side surfaces of the at least two second rewiring layers of each of the plurality of semiconductor packages.

4. The method for fabricating the semiconductor package of claim 2, wherein after forming the plastic encapsulation layer or before arranging the plurality of semiconductor elements on the side of the plurality of first rewiring structures facing away from the encapsulation layer, the method further comprises:
    forming a solder ball group on a side of the at least two second rewiring layers facing away from the plurality of semiconductor elements, wherein the solder ball group comprises a plurality of first solder halls, and the plurality of first solder balls is electrically connected to one second rewiring layer.

5. The method for fabricating the semiconductor package of claim 1, wherein each of the at least two first rewiring layers included in each of the plurality of the first rewiring layers comprises a first wire part, and each of the at least two second rewiring layers comprises a second wire part, wherein
    a first wire part of a first rewiring layer adjacent to a corresponding semiconductor element is electrically connected to pins of the corresponding semiconductor element, and a first wire part of a first rewiring layer adjacent to one of the at least two second rewiring layers is electrically connected to the second wire part of the one of the at least two second rewiring layers.

6. The method for fabricating the semiconductor package of claim 5, wherein forming the encapsulation layer comprises:
firming an encapsulation material layer on the plurality of first rewiring structures, wherein the encapsulation material layer coats the plurality of first rewiring structures; and
performing a patterned processing on the encapsulation material layer at positions corresponding to the first wire part of the one of the at least two first rewiring layers adjacent to the one of the at least two second rewiring layers to form the plurality of first through holes.

7. The method for fabricating the semiconductor package of claim 6, wherein disposing the at least two second rewiring layers on the side of the encapsulation layer facing away from the plurality of first rewiring structures comprises:
forming a first photoresist layer on the encapsulation layer;
performing a patterned processing on the first photoresist layer to form an opening at a position corresponding to each of the plurality of first through holes;
forming the second wire part of the one of the at least two second rewiring layers within openings, wherein the second wire part of the one of the at least two second rewiring layers fills the openings and the plurality of first through holes, and the one of the at least two second rewiring layers is electrically connected to the corresponding first rewiring layer through the plurality of first through holes; and
removing the remaining first photoresist layer.

8. The method for fabricating the semiconductor package of claim 6, wherein disposing the at least two second rewiring layers on the side of the encapsulation layer facing away from the plurality of first rewiring structures comprises:
forming a second material layer on the encapsulation layer, wherein the second material layer covers the encapsulation layer and fills the plurality of first through holes;
forming a second photoresist layer on the second material layer;
performing a patterned processing on the second photoresist layer;
performing an etching processing on the second material layer; and
removing the remaining second photoresist layer to form one second rewiring layer of the at least two second rewiring layers;
repeatedly performing the preceding operations on the formed second rewiring layer to form the remaining second rewiring layers of the at least two second rewiring layers one by one.

9. The method for fabricating the semiconductor package of claim 6, wherein after forming the encapsulation layer on the plurality of first rewiring structures, the method further comprises:
forming a seed layer on the encapsulation layer, wherein the seed layer covers the encapsulation layer and inner side faces of the plurality of first through holes, and the seed layer is electrically connected to the first rewiring layer adjacent to the one of the at least two second rewiring layers; and
forming the at least two second rewiring layers on the seed layer, wherein the at least two second rewiring layers are electrically connected to the seed layer;
wherein the at least two second rewiring layers are electrically connected to the exposed first rewiring layer comprises: the at least two second rewiring layers are electrically connected to the exposed first rewiring layer through the seed layer.

10. The method for fabricating the semiconductor package of claim 5, wherein forming the encapsulation layer comprises:
forming an encapsulation material layer on the plurality of first rewiring structures, wherein the encapsulation material layer coats the plurality of first rewiring structures;
thinning the encapsulating material layer to expose the first wire part of the first rewiring layer adjacent to the one of the at least two second rewiring layers, wherein the first wire part is located in first through holes of the encapsulation layer.

11. The method for fabricating the semiconductor package of claim 10, wherein arranging the at least two second rewiring layers on the side of the encapsulation layer facing away from the plurality of first rewiring structures comprises:
providing a second substrate;
fabricating the at least two second rewiring layers on the second substrate in sequence; and
turning over the second substrate, and forming a side of the at least two second rewiring layers facing away from the second substrate on the side of the encapsulation layer facing away from the plurality of first rewiring structures; or, turning over the first substrate, and disposing the side of the plurality of first rewiring structures facing away from the encapsulation layer on a side of the at least two second rewiring layers facing away from the second substrate.

12. A semiconductor package, fabricated according to the method of claim 1, and comprising:
the at least two first rewiring layers comprised in one of the plurality of first rewiring structures, wherein the one of the plurality of first rewiring structures comprises the first alignment mark;
the encapsulation layer, which is located on a side of the at least two first rewiring layers and provided with a plurality of first through holes, wherein the encapsulation layer coats the at least two first rewiring layers, and the plurality of first through holes exposes one first rewiring layer;
at least two second rewiring layers, which are located on a side of the encapsulation layer facing away from the at least two first rewiring layers, wherein the at least two second rewiring layers are electrically connected to the exposed first rewiring layer through first through holes; and
a semiconductor element, which comprises a plurality of pins, wherein the semiconductor element is located on a side of the at least two first rewiring layers facing away from the encapsulation layer, and the plurality of pins of the semiconductor element is electrically connected to the at least two first rewiring layers.

* * * * *